United States Patent
Lung et al.

(10) Patent No.: US 7,414,258 B2
(45) Date of Patent: Aug. 19, 2008

(54) SPACER ELECTRODE SMALL PIN PHASE CHANGE MEMORY RAM AND MANUFACTURING METHOD

(75) Inventors: Hsiang Lan Lung, Elmsford, NY (US); Shih-Hung Chen, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/424,123

(22) Filed: Jun. 14, 2006

(65) Prior Publication Data

US 2007/0108077 A1    May 17, 2007

Related U.S. Application Data

(60) Provisional application No. 60/737,293, filed on Nov. 16, 2005.

(51) Int. Cl.
  *H01L 29/18* (2006.01)
(52) U.S. Cl. ............ 257/4; 257/2; 257/5; 257/52; 257/154; 257/E29.088
(58) Field of Classification Search ............ 257/2, 257/4, 5, 52, 154, E29.088
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Sue A. Purvis
*Assistant Examiner*—Victor A. Mandala, Jr.
(74) *Attorney, Agent, or Firm*—Haynes Beffel & Wolfeld LLP

(57) ABSTRACT

A memory device comprising a first pan-shaped electrode having a side wall with a top side, a second pan-shaped electrode having a side wall with a top side and an insulating wall between the first side wall and the second side wall. The insulating wall has a thickness between the first and second side walls near the respective top sides. A bridge of memory material crosses the insulating wall, and defines an inter-electrode path between the first and second electrodes across the insulating wall. An array of such memory cells is provided. The bridges of memory material have sub-lithographic dimensions.

19 Claims, 24 Drawing Sheets

U.S. PATENT DOCUMENTS

| | | | |
|---|---|---|---|
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,920,788 | A | 7/1999 | Reinberg |
| 5,952,671 | A | 9/1999 | Reinberg et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,972,430 | B2 * | 12/2005 | Casagrande et al. ............ 257/4 |
| 6,992,932 | B2 | 1/2006 | Cohen |
| 7,126,149 | B2 * | 10/2006 | Iwasaki et al. ................. 257/3 |
| 7,321,130 | B2 * | 1/2008 | Lung et al. ..................... 257/4 |
| 2004/0248339 | A1 | 12/2004 | Lung |
| 2005/0215009 | A1 | 9/2005 | Cho |
| 2006/0284279 | A1 * | 12/2006 | Lung et al. .................. 257/528 |
| 2006/0286709 | A1 * | 12/2006 | Lung et al. .................. 438/102 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

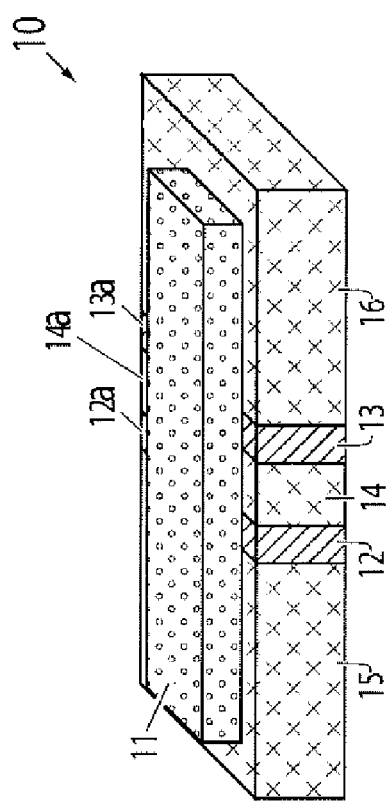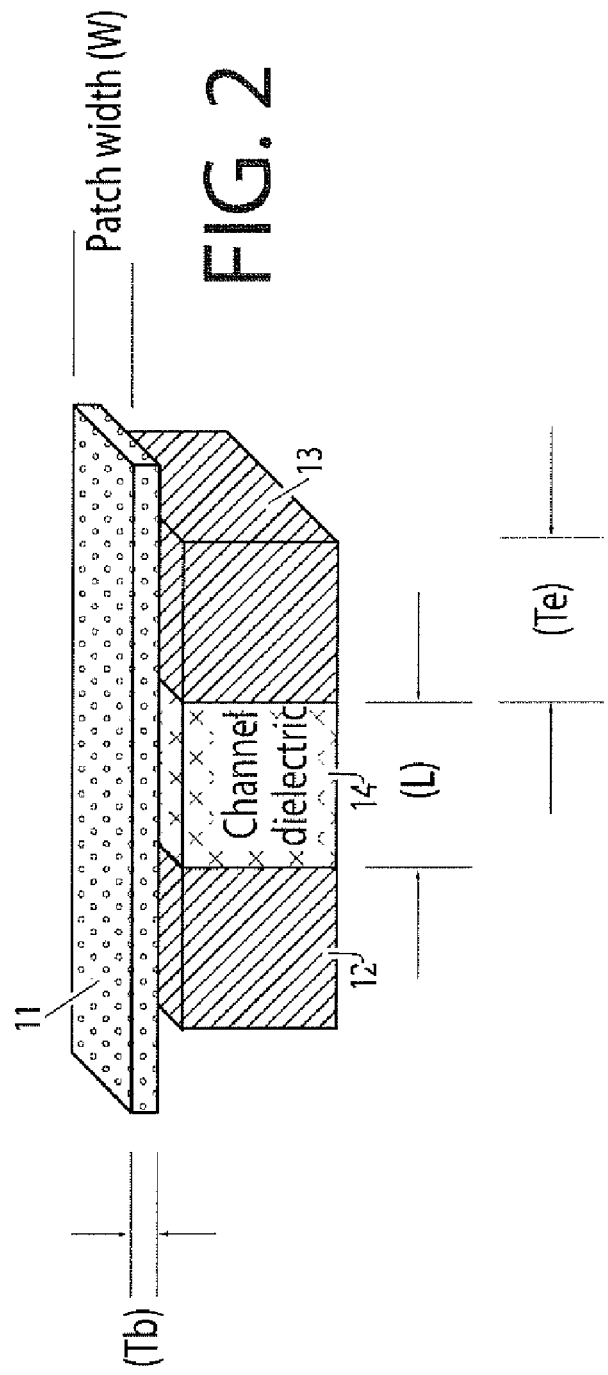

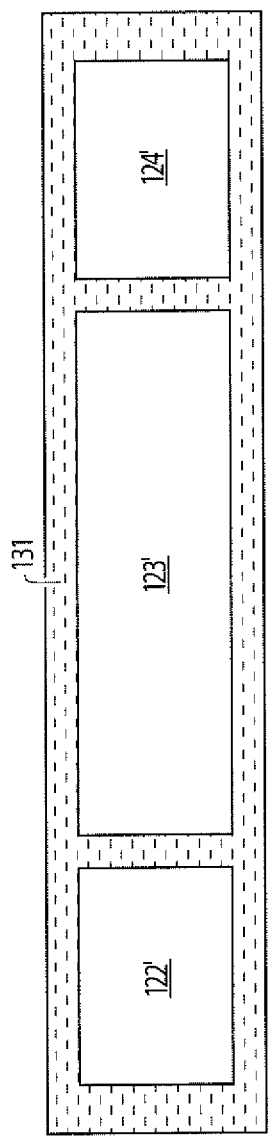
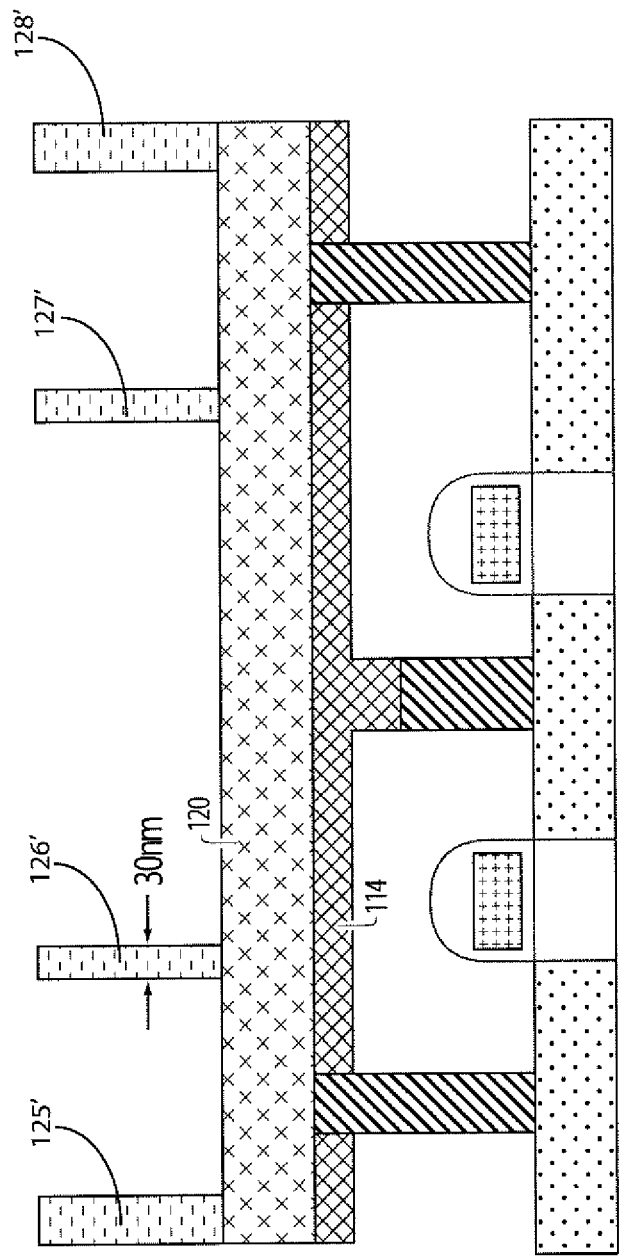
FIG. 10A
FIG. 10B

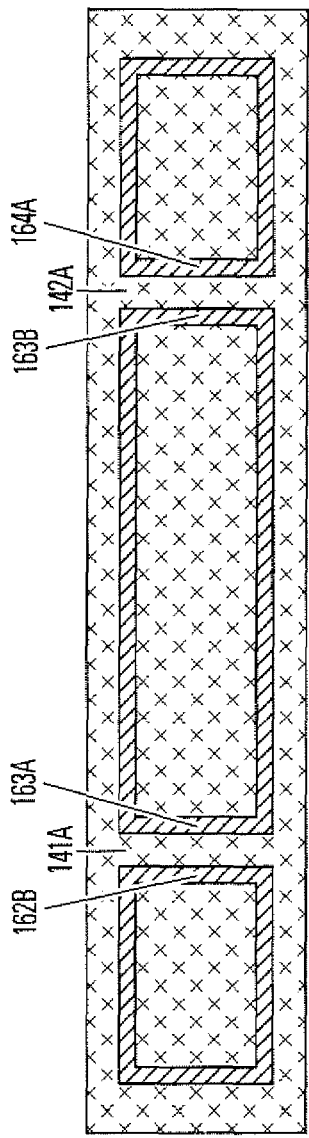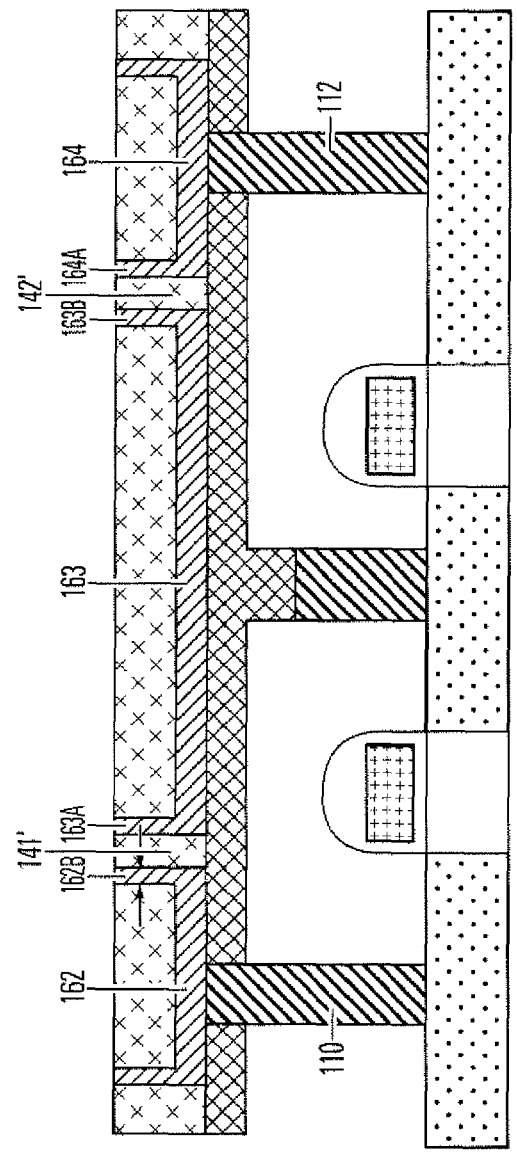

Channel width define photo

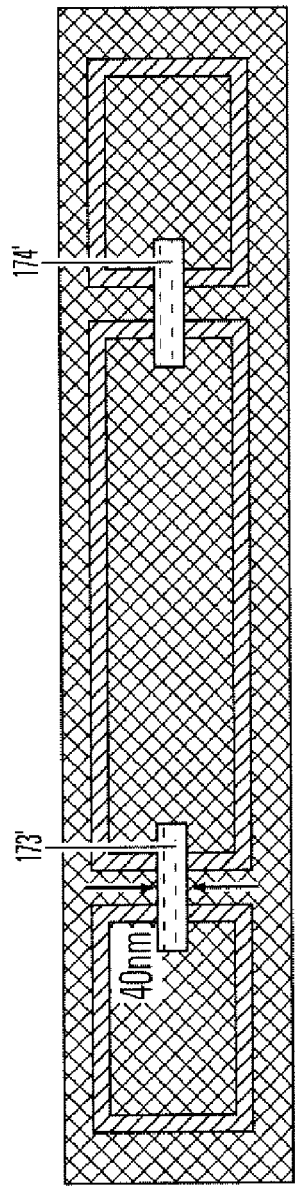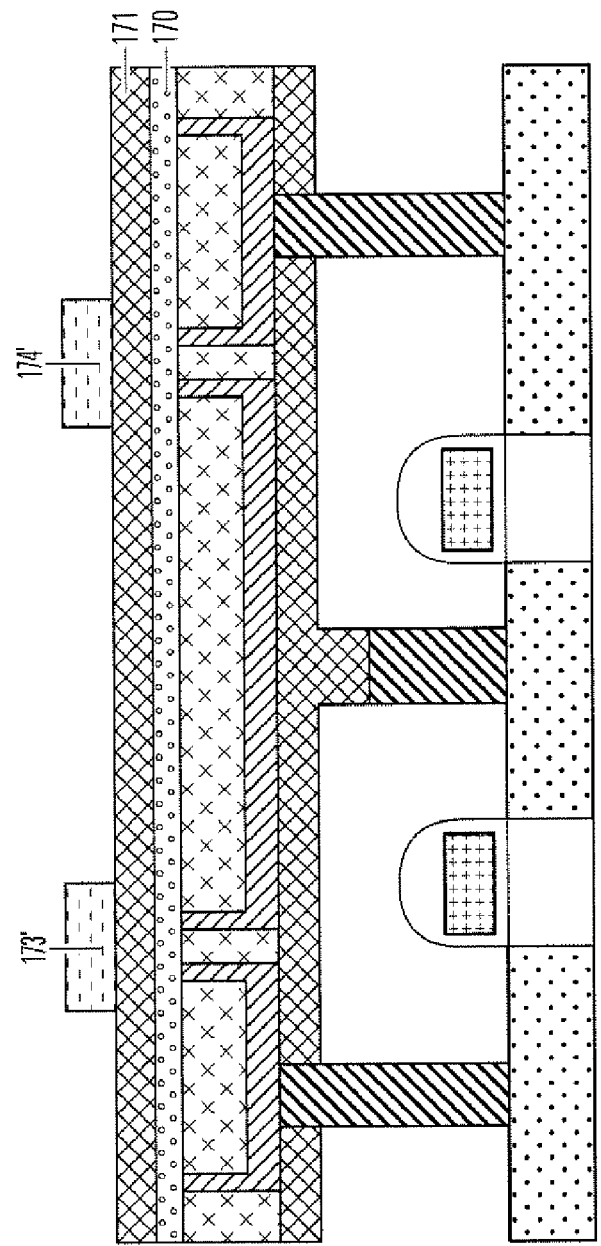

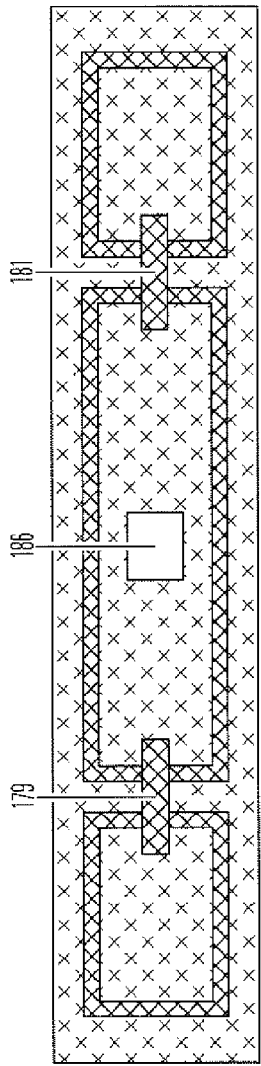
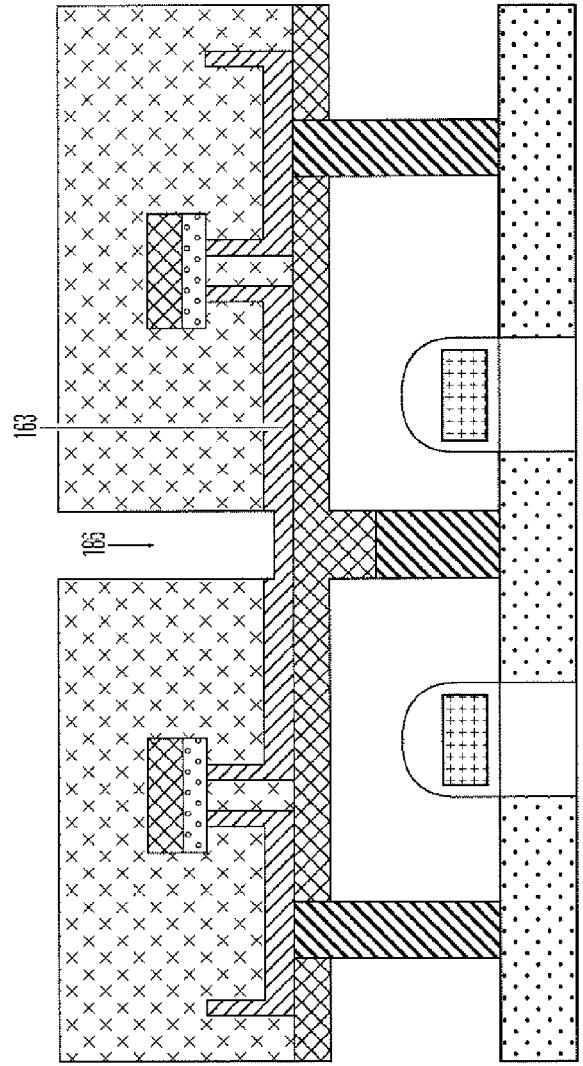

SPACER ELECTRODE SMALL PIN PHASE CHANGE MEMORY RAM AND MANUFACTURING METHOD

RELATED APPLICATION DATA

The present application claims the benefit of U.S. Provisional Patent Application No. 60/737,293; entitled SPACER ELECTRODE SMAL PIN PHASE CHANGE RAM AND MANUFACTURING METHOD, filed 16 Nov. 2005.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high-density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

A phase change random access memory PCRAM device is described suitable for use in large-scale integrated circuits. Technology described herein includes a memory device comprising a first electrode having a top side, a second electrode having a top side and an insulating wall between the first electrode and the second electrode. The first and second electrodes comprise side wall structures, or spacers, on an inter-electrode insulating wall, in embodiments described herein that are part of a pan-shaped electrode member. The pan-shaped electrode member includes a pad member having a perimeter, and side wall structures extending orthogonally from the pad member near the perimeter of the pad member. (The descriptor "pan-shaped" does not imply for the purposes of this description, that the vertical dimension of the side wall structures has any particular relative size compared to the horizontal dimension of the pad member). A thin film bridge of programmable resistive material crosses the insulating wall, and defines an inter-electrode path between the first and second electrodes across the insulating wall. The insulating wall has a thickness between the first and second electrodes near the top side of the first electrode and the top side of the second electrode. The inter-electrode path across the insulating wall has a path length defined by the thickness of the insulating wall. For the phase change memory, the bridge comprises memory material having at least two solid phases that are reversible, such as a chalcogenide-based material or other related material, by applying a current through the material or applying a voltage across the first and second electrodes.

The active volume of memory material subject of programmable resistance can be very small, determined by the thickness of the insulating wall (path length in the x-direction), the thickness of the thin film used to form the bridge (y-direction), the width of the bridge orthogonal to the path length (z-direction), and the width of the side wall electrode structures acting as contacts to the bridge. The width of the side wall electrode structures and the thickness of the thin film of memory material used to form the bridge are determined in embodiments of the technology by thin film thicknesses which are not limited by the lithographic processes used in manufacturing the memory cell. The width of the bridge and the thickness of the insulation wall are also smaller than a minimum feature size F that is specified for a lithographic process used in patterning the layer of material in embodiments of the present invention. In one embodiment, thickness of the insulating wall and the width of the bridge are defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the more narrow pattern onto the layer of insulating material on memory material. Also, other techniques can be used to form narrow lines of material in a layer on an integrated circuit. Accordingly, a phase change memory cell with simple structure achieves very small reset current and low power consumption, and is easily manufactured.

In embodiments of the technology described herein, an array of memory cells is provided. In the array, a plurality of electrode members and insulating walls therebetween comprise an electrode layer on an integrated circuit. The electrode layer has a top surface, which is substantially planar in some embodiments of the invention. The corresponding plurality of thin film bridges across the insulating walls between pairs of electrode members comprise memory elements on the top surface of the electrode layer. A current path from a first electrode in the electrode layer through a thin film bridge on the top surface of the electrode layer to a second electrode in the electrode layer is established for each memory cell in the array.

Circuitry below the electrode layer on integrated circuits described herein can be implemented using well understood technology for logic circuitry and memory array circuitry, such as CMOS technology.

Also, in one array embodiment described herein, circuitry above the electrode layer includes a plurality of bit lines. In an embodiment having bit lines above the electrode layer that is described herein, electrode members in the electrode layer which act as a first electrode for a memory cell are shared so that a single electrode member provides a first electrode for two memory cells in a column of the array. Also, in an embodiment that is described herein, bit lines in the plurality of bit lines are arranged along corresponding columns in the array, and two adjacent memory cells in the corresponding columns share a contact structure for contacting said first electrodes.

A method for manufacturing a memory device is also described. The method comprises forming an electrode layer on a substrate, which comprises circuitry made using front-end-of-line procedures. The electrode layer in this method has a top surface. The electrode layer includes a first pan-shaped electrode member and a second pan-shaped electrode member, and an insulating wall between the first and second pan-shaped electrode members for each memory cell to be formed. The side wall structures on the first and second pan-shaped electrode members and the insulating wall extend to the top surface of the electrode layer, and the insulating wall has a width between the sidewall structures at the top surface, as described above in connection with the phase change memory cell structures. One method described herein includes forming the a narrow insulating member on the substrate, where the narrow insulating member has a thickness less than the minimum feature size of the lithographic process used in manufacturing a front-end-of-line structures. An electrode material, such as titanium nitride, is deposited in a conformal manner over the narrow insulating members on the substrate.

Alternatively, a two-step procedure is executed including deposition of a tungsten fill, or other suitable metal, to fill between the narrow insulating members. The tungsten fill is etched back using for example a fluorine-based reactive ion etching technique, to expose side walls on the narrow insulating members. Then, a thin film, conformal layer of electrode material such as titanium nitride is formed over the narrow insulating members.

The resulting structure is etched back by chemical mechanical planarization, or other similar procedures, to expose a top of the insulating member, and the electrode material on the sidewalls of insulating material. Electrode material continues down the side wall into horizontal pad regions on the substrate between the insulating members to form first and second electrodes on either side of the insulating members. The resulting structure is filled with a fill material, such as a silicon dioxide or other insulator, and then re-planarized. The resulting re-planarized structure can be referred to as the electrode layer. The method also includes forming a bridge of memory material on the top surface of the electrode layer across the insulating member for each memory cell to be formed. The bridge comprises a film of memory material having a first side and a second side and contacts the first and second electrodes on the first side. The bridge defines an inter-electrode path between the first and second electrodes across the insulating member having a path length defined by the width of the insulating member. In embodiments of the method, an access structure over the electrode layer is made by forming a patterned conductive layer over said bridge, and forming a contact between said first electrode and said patterned conductive layer.

In an embodiment of the manufacturing method, the electrode layer is made by a process comprising a number of steps including the following:

forming a dielectric layer on a substrate;

etching the dielectric layer to form narrow insulating members;

forming a conductive layer over the dielectric layer to form sidewall conductor structures;

polishing the conductive layer, by chemical mechanical polishing or otherwise, to define the electrode layer, wherein the sidewall conductors and insulating members are exposed on the top surface and act as the insulating member, the first electrode, and the second electrode.

The narrow insulating members can be formed by patterning a layer of resist material using a lithographic process to define trenches in the dielectric layer, with strips positioned to define narrow walls between the trenches. Then, the width of the strips is trimmed to define a more narrow stripe of the resist material. The more narrow stripe of resist material is then used as an etch mask to form the insulating members. Alternatively, the narrow insulating members can be defined using a lithographic process to define trenches in the dielectric layer, with strips positioned to define narrow walls between the trenches, as in the just mentioned alternative, followed by an isotropic etch. Isotropic etching can be accomplished by a wet dip in dilute hydrofluoric acid for a silicon dioxide insulating member, or in a dilute phosphoric acid for a silicon nitride insulating member.

In an embodiment of the manufacturing method, the bridges of memory material are made by a process comprising a number of steps including the following:

forming a layer of memory material on the top surface of the electrode layer;

forming a layer of resist material over the layer of memory material;

patterning the layer of resist material using a lithographic process to define a patches corresponding to locations of memory elements;

trimming the width of the patches to define a more narrow, trimmed patches of resist material over the layer of memory material;

etching the layer of memory material which is not protected by the trimmed patches of resist material to form the bridges of memory material.

Other aspects and advantages of the invention are described below with reference to the figures.

BRIEF DESCRIPTION OF THE DRAWINGS

FIG. 1 illustrates an embodiment of a thin film bridge phase change memory element.

FIG. 2 illustrates dimensions for a thin film bridge phase change memory element as shown in FIG. 1.

FIGS. 10A and 10B a next stage in the process involving trimming of the lithographic mask shown in FIGS. 9A and 9B.

FIGS. 17A and 17B show layout and cross-sectional views of a next stage after etchback of the structure of FIG. 16.

FIGS. 20A and 20B show layout and cross-sectional views of trimmed masks used for patterning the layer of memory material of FIG. 18, to define bridges of memory material having sub-lithographic dimensions on the electrode layer.

FIGS. 23A and 23B show layout and cross-sectional views corresponding to steps for forming a via in the fill of FIG. 22.

DETAILED DESCRIPTION

Figure 3:
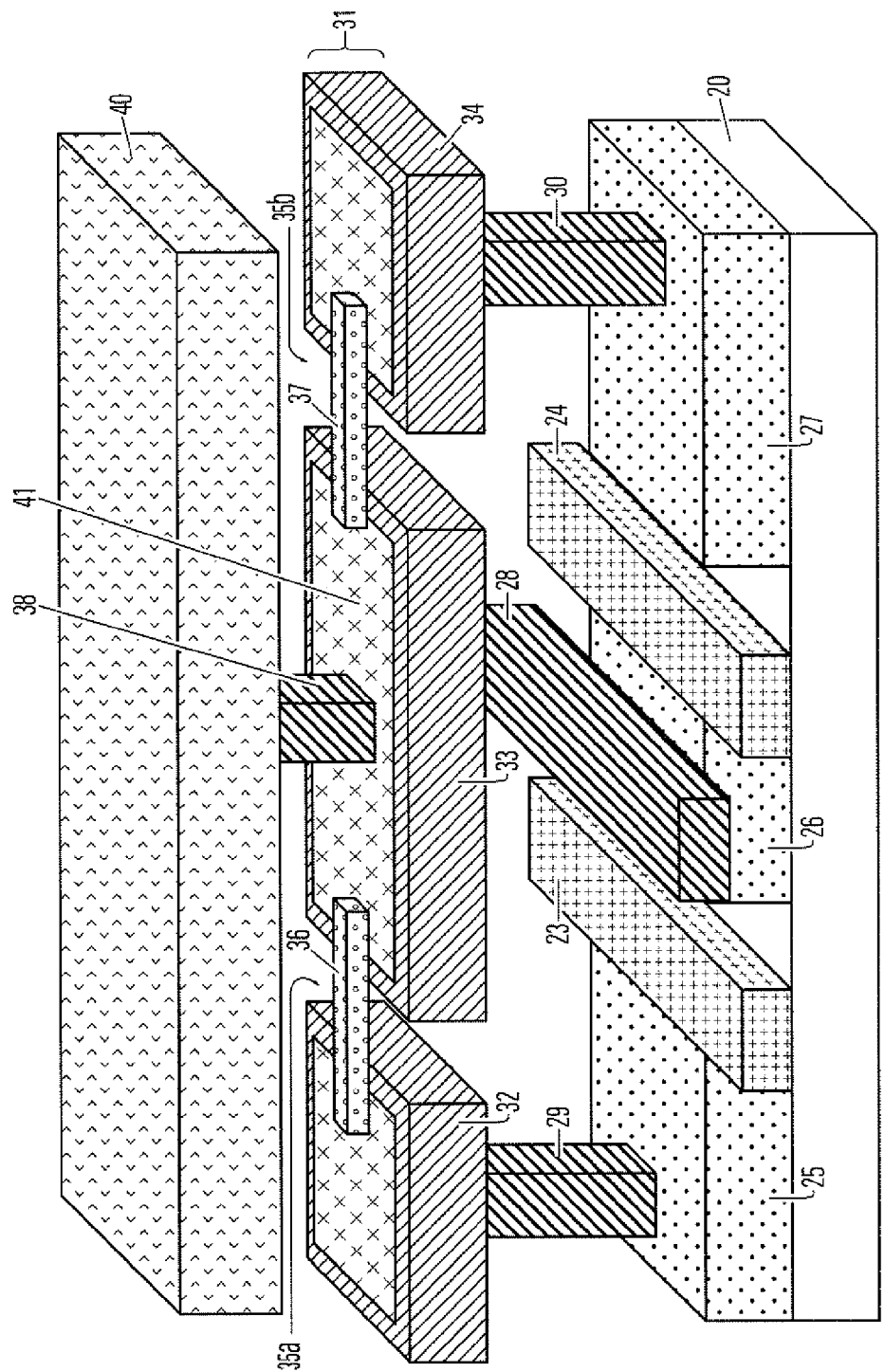
FIG. 3 illustrates a structure for a pair of phase change memory elements with access circuitry below an electrode layer and bit lines above the electrode layer.

A detailed description of thin film fuse phase change memory cells, arrays of such memory cells, and methods for manufacturing such memory cells, is provided with reference to FIGS. 1-25.

FIG. 1 illustrates a basic structure of a memory cell 10 including a bridge 11 of memory material on an electrode layer which comprises a first electrode 12, a second electrode 13, and an insulating wall 14 between the first electrode 12 and the second electrode 13. The first and second electrodes comprise thin film sidewall structures. Insulating fill 15, 16 is adjacent to the sidewall structures, and provides for planarization of the top surface for support of the bridge 11. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface of the electrode layer in the illustrated embodiment. The bridge 11 of memory material lies on the planar top surface of the electrode layer, so that contacts between the first electrode and the bridge 11 and between the second electrode 13 and the bridge 11 are made on the bottom side of the bridge 11.

In operation, a current path from the first electrode 12, through the bridge 11, to the second electrode 13 is formed by the memory cell structure. Access circuitry can be implemented to contact the first electrode 12 and the second electrode 13 in a variety of configurations for controlling the operation of the memory cell, so that it can be programmed to set the bridge 11 with a programmable resistance to indicate a data value. For example, using a chalcogenide-based phase change memory material, the memory cell may be set to a relatively high resistivity state in which at least a portion of the bridge in the current path is an amorphous state, and a relatively low resistivity state in which all or most of the bridge in the current path is in a crystalline state.

The active channel of the cell 10 is the region for a phase change memory cell embodiment in which the material is induced to change between the at least two solid phases. As can be appreciated, the active channel can be made extremely small in the illustrated structure, reducing the magnitude of current needed to induce the phase changes.

FIG. 2 illustrates important dimensions of the memory cell 10. The length L (x-dimension) of the active channel is defined by the thickness of the insulating wall 14 (called channel dielectric in the figure), between the first electrode 12 and the second electrode 13. This length L can be controlled by controlling the width of the insulating wall 14 in embodiments of the memory cell. In representative embodiments, the width of the insulating wall 14 can be established using sub-lithographic patterning technique to form a thin insulating wall having a dimension less than the minimum lithographic feature size for a process used to make access structures on the device. Thus, embodiments of the memory cell have a channel length L less than 50 nm. Other embodiments have a channel length L of about 40 nm or less.

Likewise the electrode thickness Te is less than 100 nm, and less than 50 nm in some embodiments. In preferred embodiments for phase change memory cells, the electrode thickness Te is about 20 nm or less. Likewise, the bridge thickness Tb (y-dimension) can be very small in embodiments of the memory cell. This bridge thickness Tb can be established using a thin film deposition technique on the top surfaces of the first electrode 12, insulating wall 14, and second electrode 13. Thus, embodiments of the memory cell have a bridge thickness T about 50 nm or less. Other embodiments of the memory cell have a bridge thickness of about 20 nm or less. In yet other embodiments, the bridge thickness T is about 10 nm or less. It will be understood that the bridge thickness Tb can be even smaller than 5 nm, using thin film deposition techniques such as atomic layer deposition and the like, according to the needs of the particular application, so long as the thickness is sufficient for the bridge performs its purpose as memory element, having at least two solid phases, reversible by a current or by a voltage applied across the first and second electrodes.

As illustrated in FIG. 2, the bridge width W (z-dimension) is likewise very small. This bridge width W is implemented in preferred embodiments, so that it has a width less than 50 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ce/Sb/Te, In/Sb/Te, Ga/Se/Te, Sn/Sb/Te, In/Sb/Ge, Ag/In/Sb/Te, Ge/Sn/Sb/Te, Ce/Sb/Se/Te and Te/Ge/Sb/S. In the family of Ge/Sb/Te alloys, a wide range of alloy compositions may be workable. The compositions can be characterized as $Te_aCe_bSb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ce—Sb—Te Phase-Change Optical Disks for High-Data-Rate Recording", *SPIE v.* 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive materials may be used in other embodiments of the invention, including $N_2$ doped GST, $Ge_xSb_y$, or other material that uses different crystal phase changes to determine resistance; $Pr_xCa_yMnO_3$, $Pr_xS-r_yMnO_3$, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse.

FIG. 3 depicts a structure for PCRAM cells. The cells are formed on a semiconductor substrate 20. Isolation structures such as shallow trench isolation STI dielectrics (not shown) isolate pairs of rows of memory cell access transistors. The access transistors are formed by n-type terminal 26 acting as a common source region and n-type terminals 25 and 27 acting as drain regions in a p-type substrate 20. Polysilicon wordlines 23 and 24 form the gates of the access transistors. A dielectric fill layer (not illustrated to allow perspective view of the other structures) is formed over the polysilicon wordlines. The layer is patterned and conductive structures, including common source line 28 and plug structures 29 and 30 are formed. The conductive material can be tungsten or other materials suitable for the plug and line structures. The common source line 28 contacts the source region 26, and acts as a common source line along a row in the array. The plug structures 29 and 30 contact the drain terminals 25 and 26, respectively. The fill layer (not shown), the common source line 28 and the plug structures 29 and 30, have a generally planar top surface, or are otherwise suitable for use as a substrate for formation of an electrode layer 31.

The electrode layer 31 includes electrode members 32, 33 and 34, which are separated from one another by insulating walls 35a and 35b. The electrode members 32, 33, 34 comprise an electrode material, such as TiN, suitable for contact with the bridges 36, 37 described below. The electrode members in the embodiment shown comprise thin film structures which are pan-shaped with a bottom pad layer and side wall structures, formed for example by depositing a conformal layer of electrode material over trenches in the inter-layer dielectric, filling the electrode material covered trenches with an insulator filling 41, and etching back the resulting structure to expose the insulating walls 35a, 35b. The bottom pad layers of the electrodes 32 and 34 contact the plugs 29 and 30 respectively. The plug 38, extends through the insulator filling 41 to the bottom pad layer of electrode 33.

A thin film bridge 36 of memory material, such as GST, overlies the electrode layer 31 on one side traversing across the insulating wall 35a, forming a first memory cell, and a thin film bridge 37 of memory material, such as GST, overlies the electrode layer 31 on another side traversing across the insulating wall 35b, forming a second memory cell.

A dielectric fill layer (not illustrated to allow perspective view of the other structures) overlies the thin film bridges 36, 37. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the bridges. Conductive plug 38 extends through the dielectric filler 41 contacts the electrode member 33 beneath the filler 41. A patterned conductive layer 40, comprising metal or other conductive material, including bit lines in an array structure, overlies the dielectric fill layer, and contacts the plug 38 to establish access to the memory cells corresponding to the thin film bridge 36 and the thin film bridge 37.

In operation, access to the memory cell corresponding with bridge 36 is accomplished by applying a control signal to the wordline 23, which couples the common source line 28 via terminal 25, plug 29, and electrode member 32 to the thin film bridge 36. Electrode member 33 is coupled via the contact plug 38 to a bit line in the patterned conductive layer 40. Likewise, access to the memory cell corresponding with bridge 37 is accomplished by applying a control signal to the wordline 24.

Figure 4:
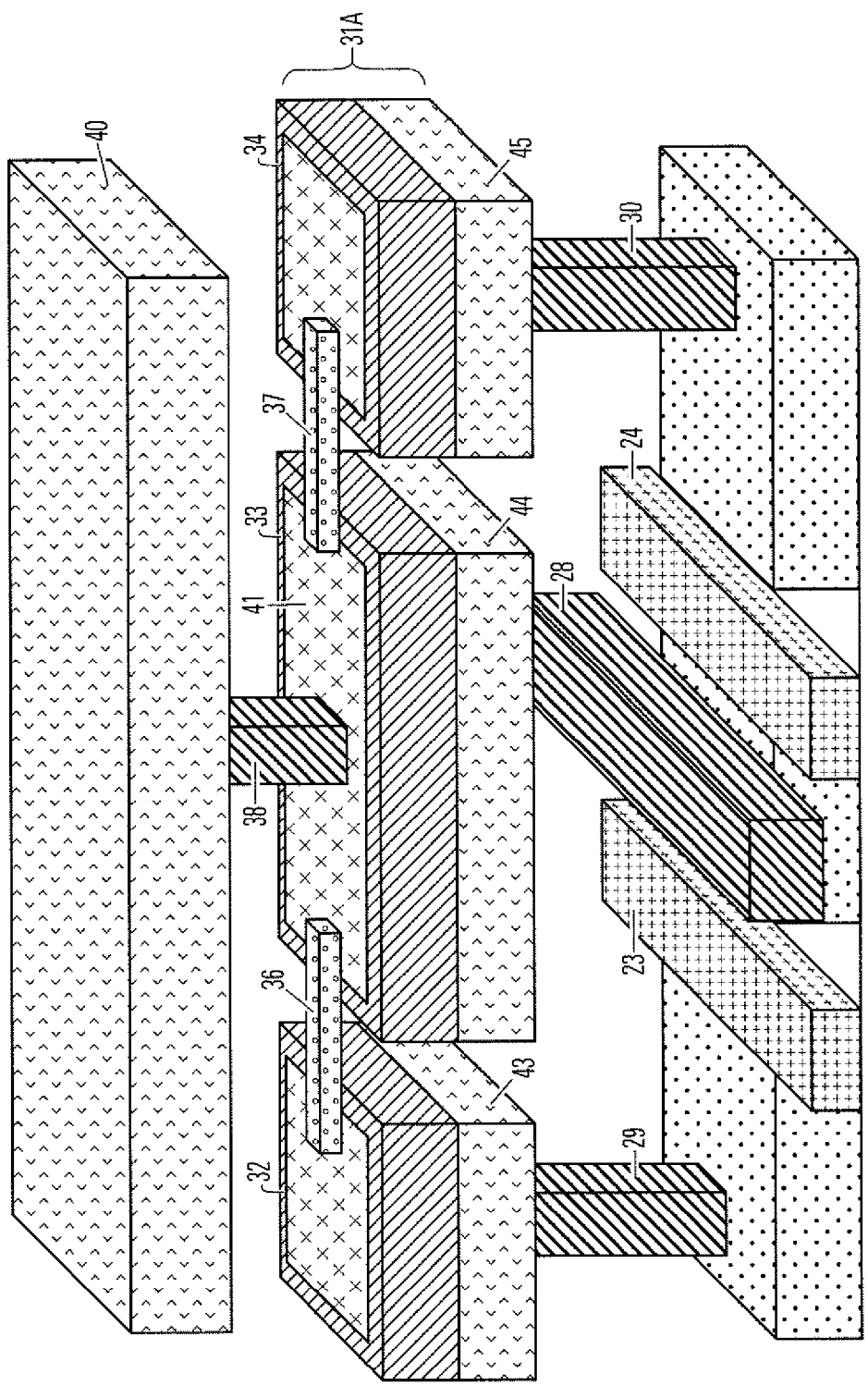
FIG. 4 illustrates an alternative structure for a pair of phase change memory elements with access circuitry below an electrode layer and bit lines above the electrode layer.

FIG. 4 illustrates an alternative to the structure of FIG. 3. In FIG. 4, the electrode layer 31A is formed over a patterned metal layer, such as a first patterned metal layer on the device. The reference numbers used on FIG. 4 match those of FIG. 3 and are not described again. The difference includes metal pads 43, 44 and 45 below the electrodes 32, 33 and 34 respectively. The metal pads are formed by forming a metallization pattern on the device, using standard metals such as tungsten based metals or Al based metals, and etching back the metallization pattern in the memory device area to provide metal pads on which to form the pan-shaped electrodes 32, 33, and 34. The plugs 29 and 30 contact the metal pads 43 and 45, respectively. Plug 38 contacts the electrode 33, and may extend through the electrode 33 to the metal pad 44, allowing for additional process margin in the manufacture of the plug 38.

It will be understood that a wide variety of materials can be utilized in implementation of the structure illustrated in FIGS. 3 and 4. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The inter-electrode insulating walls 35a, 35b may be silicon oxide, silicon oxynitride, silicon nitride, $Al_2O_3$, or other low K dielectrics. Alternatively, the inter-electrode insulating layer may comprise one or more elements selected from the group consisting of Si, Ti, Al, Ta, N, O, and C.

Figure 5:
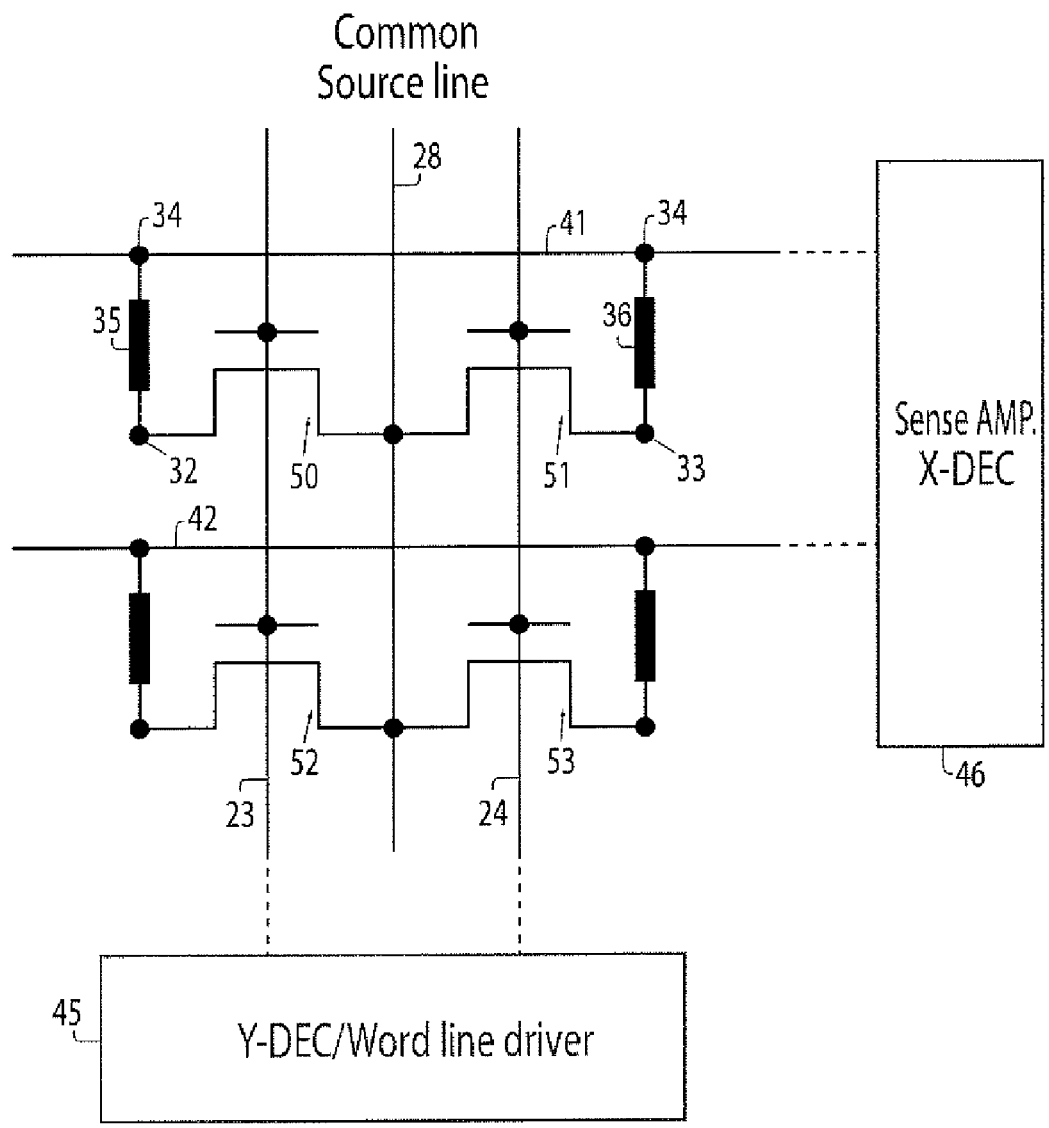
FIG. 5 is a schematic diagram for a memory array comprising phase change memory elements.

FIG. 5 is a schematic illustration of a memory array, which can be implemented as described with reference to FIGS. 3 and 4. Thus, reference numerals for elements of FIG. 5 match corresponding elements in the structure of FIGS. 3 and 4. It will be understood that the array structure illustrated in FIG. 5 can be implemented using other cell structures. In a schematic illustration of FIG. 5, the common source line 28, the wordline 23 and the wordline 24 are arranged generally parallel in the Y-direction. Bit lines 41 and 42 are arranged generally parallel in the X-direction. Thus, a Y-decoder and a wordline driver in block 45 are coupled to the wordlines 23, 24. An X-decoder and set of sense amplifiers in block 46 are coupled to the bit lines 41 and 42. The common source line 28 is coupled to the source terminals of access transistors 50, 51, 52 and 53. The gate of access transistor 50 is coupled to the wordline 23. The gate of access transistor 51 is coupled to the wordline 24. The gate of access transistor 52 is coupled to the wordline 23. The gate of access transistor 53 is coupled to the wordline 24. The drain of access transistor 50 is coupled to the electrode member 32 for bridge 35, which is in turn coupled to electrode member 34. Likewise, the drain of access transistor 51 is coupled to the electrode member 33 for bridge 36, which is in turn coupled to the electrode member 34. The electrode member 34 is coupled to the bit line 41. For schematic purposes, the electrode member 34 is illustrated at separate locations on the bit line 41. It will be appreciated that separate electrode members can be utilized for the separate memory cell bridges in other embodiments. Access transistors 52 and 53 are coupled to corresponding memory cells as well on line 42. It can be seen that the common source line 28 is shared by two rows of memory cells, where a row is arranged in the Y-direction in the illustrated schematic. Likewise, the electrode member 34 is shared by two memory cells in a column in the array, where a column is arranged in the X-direction in the illustrated schematic.

Figure 6:
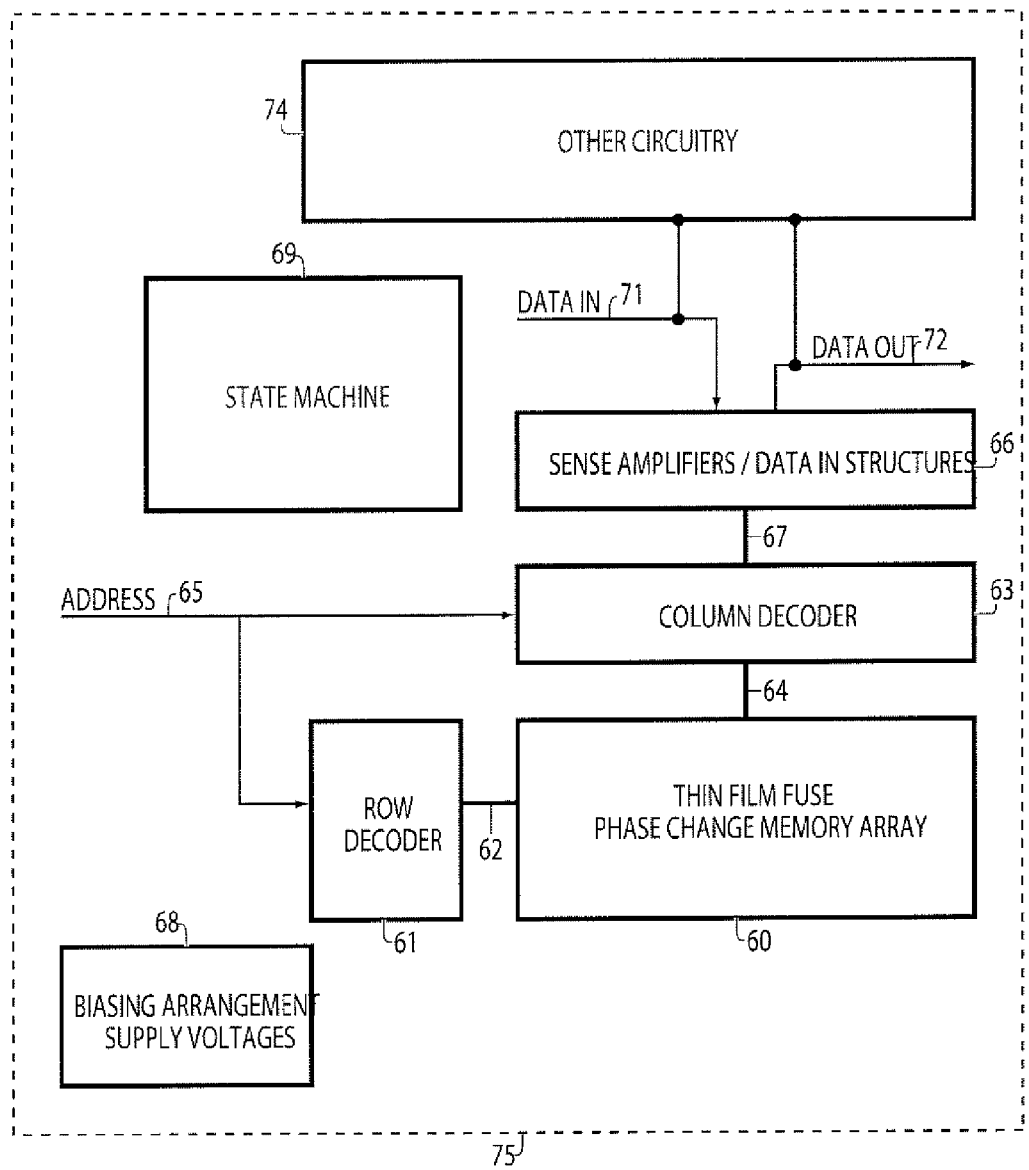
FIG. 6 is a block diagram of an integrated circuit device including a thin film fuse phase change memory array and other circuitry.

FIG. 6 is a simplified block diagram of an integrated circuit according to an embodiment of the present invention. The integrated circuit 75 includes a memory array 60 implemented using thin film fuse phase change memory cells, on a semiconductor substrate. A row decoder 61 is coupled to a plurality of wordlines 62, and arranged along rows in the memory array 60. A column decoder 63 is coupled to a plurality of bit lines 64 arranged along columns in the memory array 60 for reading and programming data from the multiple-gate memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry 74 is included on the integrated circuit 75, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 7:
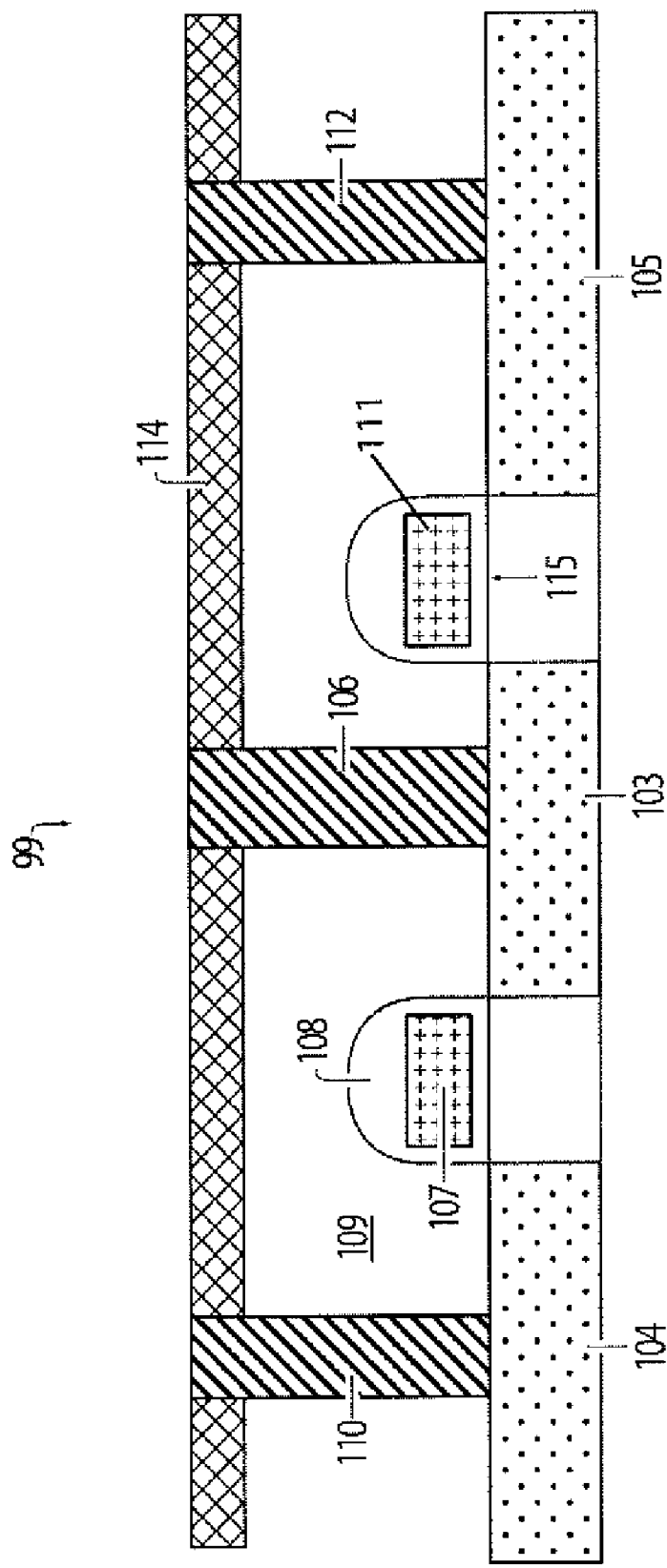
FIG. 7 is a cross-section of a substrate that includes access circuitry formed by front-end-of-line processes, made in a process for manufacturing a phase change memory device based on the structure shown in FIG. 3.

FIG. 7 illustrates a structure after front-end-of-line processing, forming the standard CMOS components in the illustrated embodiment corresponding to the wordlines, the source line, and the access transistors in the array shown in FIG. 5. In FIG. 7, source line 106 overlies doped region 103 in the semiconductor substrate, where the doped region 103 corresponds with the source terminal of a first access transistor on the left in the figure, and of a second access transistor on the right in the figure. At this stage, the source line 106 extends to the top surface of the structure 99. Doped region 104 corresponds with the drain terminal of the first access transistor. A wordline including polysilicon 107, and silicide cap 108, overlies a gate oxide layer 115 and acts as the gate of the first access transistor. Dielectric layer 109 overlies the polysilicon 107 and silicide cap 108. In this embodiment, a layer 114 of etch stop material such as SiN is formed over dielectric layer 109. The layer 114 can be about 50 nm thick in an embodiment of the memory device. Plug 110 contacts doped region 104, and provides a conductive path to the surface of the structure 99 for contact to a memory cell electrode as described below. The drain terminal of the second access transistor is provided by doped region 105. A wordline including polysilicon line 111, and the silicide cap (not labeled) acts as the gate for the second access transistor. Plug 112 contacts doped region 105 and provides a conductive path to the top surface of the structure 99 for contact to a memory cell electrode as described below. Isolation trenches (not shown) separate the two-transistor structure coupled to the plugs 110 and 112, from adjacent two-transistor structures. The structure 99 illustrated in FIG. 7 provides a substrate for formation of memory cell components, including the first and second electrodes, and the bridge of memory material, as described in more detail below.

Figure 8:
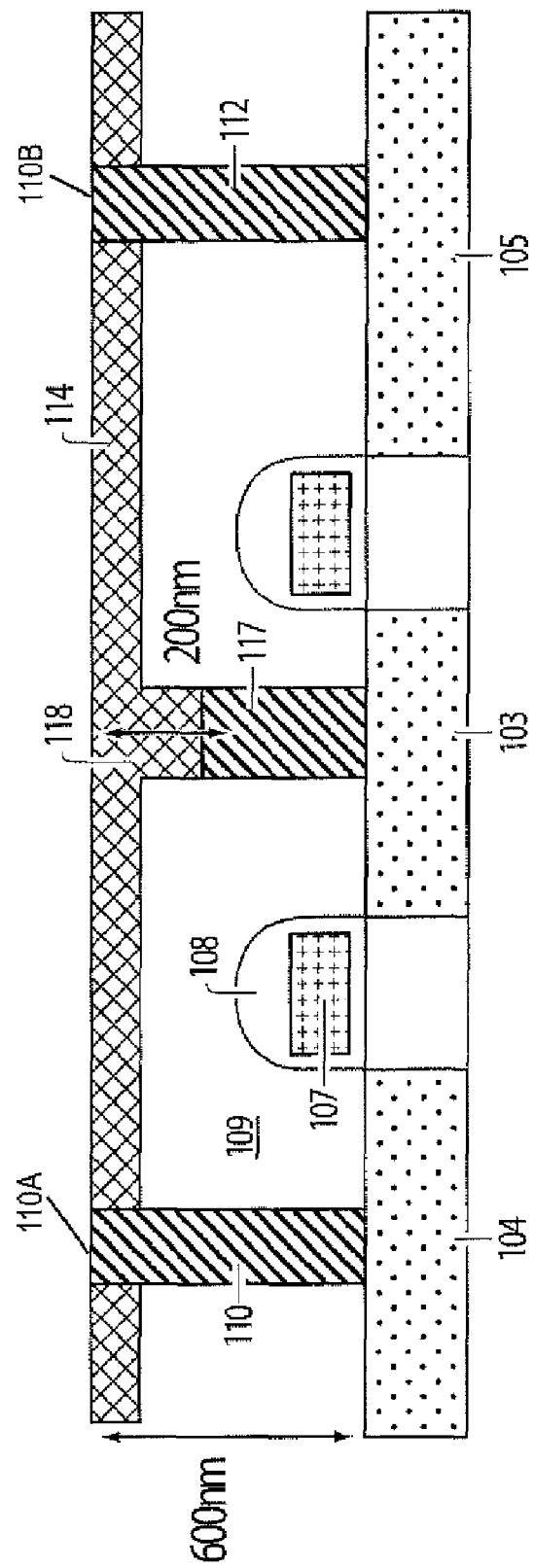
FIG. 8 is a cross-section showing next stage in formation of substrate for an electrode layer for the structure shown in FIG. 3.

FIG. 8 illustrates a next stage in a process for manufacturing a memory device, after partially etching back the source line 106 to form etched back source line 117. In this embodiment, the source line 106 comprises a tungsten structure formed in the same deposition step as used to form the tungsten plugs 110, 112. The tungsten structure is partially etched back to form source line 117, by applying a lithographic mask to protect the plugs 110, 112 from the etch process, etching the source line 106, and then re-filling the etched back region with the material of layer 114, such as silicon nitride. The resulting structures are then etched back using chemical mechanical polishing, or other techniques, to form an insulating structure 118 preventing a short between the source line 117 and overlying structures. At this stage, the top surface 110A of plug 110, and atop surface 112A of plug 112 are exposed on the surface of the structure 99. In alternative embodiments, the source line can be manufactured in manufacturing steps that are separate from those used to form the tungsten plugs 110, 12, and comprise metal lines formed prior to deposition of the dielectric layer 109 that are completely covered by dielectric layer 109, and not exposed at the surface of the structure 99. In yet another alternative, the source line can be implemented using an implanted region in the substrate, such that the source region 103 consists of a continuous line extending to a source of a voltage, or decoding circuitry as known in the art.

Figure 9A:
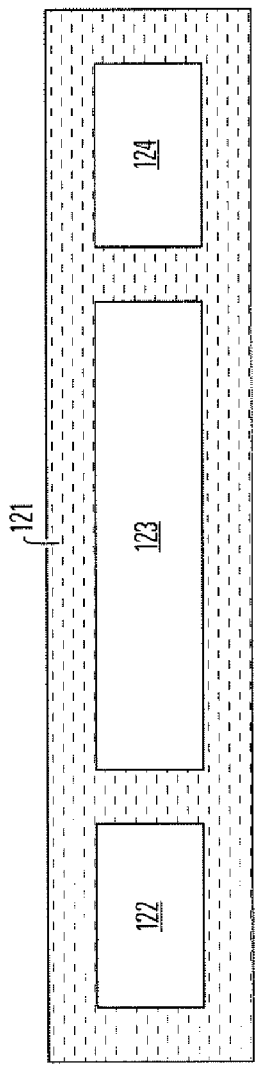
FIGS. 9A and 9B show layout and cross-sectional views of a next stage in the manufacturing process showing deposition of an oxide layer and formation of a lithographic mask.
Figure 9B:
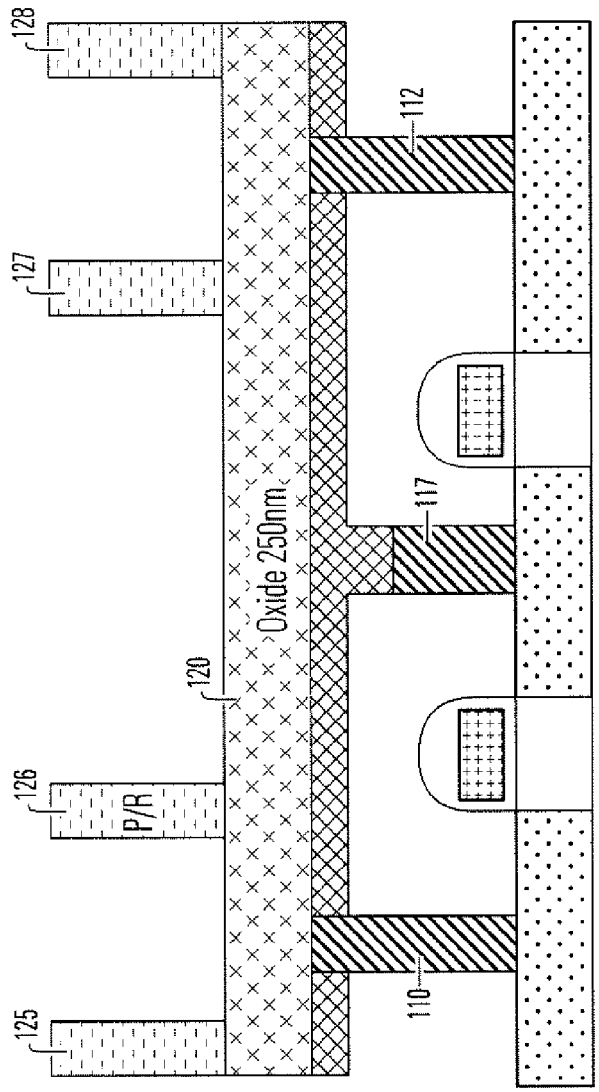

FIGS. 9A and 9B illustrate a next stage in the process, in which an insulating layer 120 formed using silicon dioxide or other similar material is deposited over the surface of the structure 99. In the illustrate example, the layer 120 comprises a silicon dioxide having a thickness of about 250 nanometers. After formation of the layer 120, a lithographic mask 121 is formed using a photoresist or other materials, having a pattern as illustrated in FIG. 9A. The pattern of the mask 121 defines openings 122, 123, 124 corresponding to regions in which trenches will be etched in the layer 120. FIG. 9B shows mask features 125, 126, 127, 128 in cross-section, defining the position of walls of the trenches to be etched.

FIGS. 10A and 10B illustrate a next stage in the process, in which the mask 121 is trimmed to form a trimmed mask 131. The pattern of the mask 131 defines openings 122', 123', 124' corresponding to regions in which trenches will be etched in the layer 120. FIG. 10B shows mask features 125', 126', 127', 128' defining the position of walls of the trenches to be etched. In the mask 121 can be trimmed using a plasma trimming technique based on oxygen plasma so that the widths of at least the mask features 126' and 127' will be less than the minimum lithographic feature size used to define mask 121, and can be for example about 40 nanometers or less, and in the example illustrated about 30 nanometers. The width of the mask features 125', 126', 127', 128' can be adjusted as suits the needs of a particular implementation, and the manufacturing technique utilized for manufacture of the lithographic mask.

Figure 11:
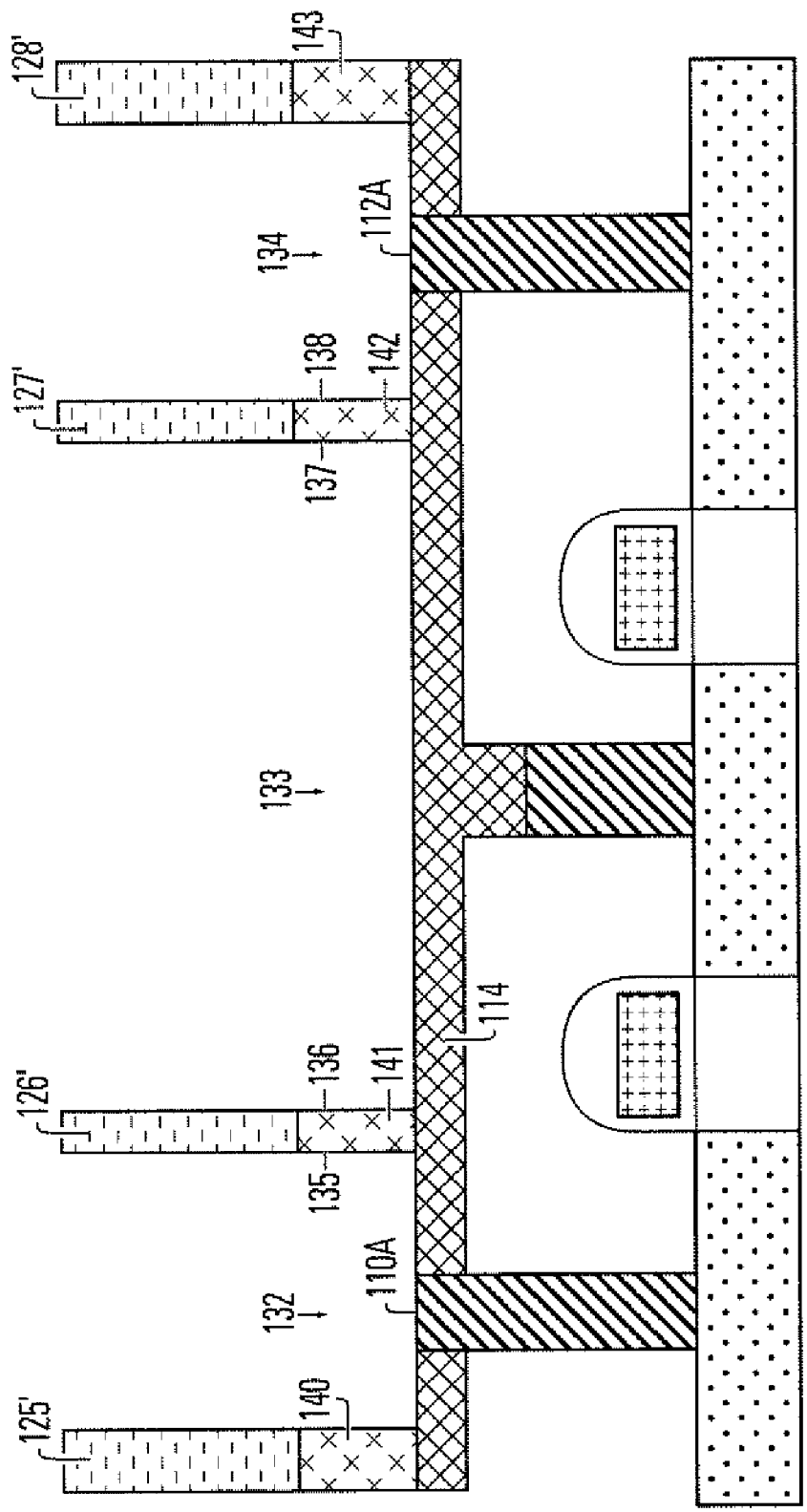
FIG. 11 shows a cross-sectional view of a next stage in the process involving an etch according to the pattern of the trimmed masks.

FIG. 11 illustrates a next stage in the process after etching the trenches 132, 133, 134 using the mask 131 in the insulating layer 120. The features 125', 126', 127', 128' define the position of insulating walls 140, 141, 142, 143 which are left after etching the insulating layer 120. The insulating wall 141 has a side wall 135 on the left side of the figure, and a sidewall 136 on the right side in figure. Likewise, insulating wall 142 has a side wall 137 on the left side in the figure, and a sidewall 138 on the right side in the figure. The etch of the layer 120 exposes the top surface 110A of the plug 110, and a top surface 112A of the plug 112. The etch of the layer 120 is stopped at the top surface of the silicon nitride layer 114. Then the photoresist is removed.

Alternatively, the narrow insulating members can be defined by etching using the masks defined in the step of FIGS. 9A and 9B to define trenches in the dielectric layer, with strips positioned to define narrow walls between the trenches. The thickness of the insulating walls is then trimmed using an isotropic etch. Isotropic etching can be accomplished by a wet dip in dilute hydrofluoric acid for a silicon dioxide insulating member, or in a dilute phosphoric acid for a silicon nitride insulating member.

Figure 12:
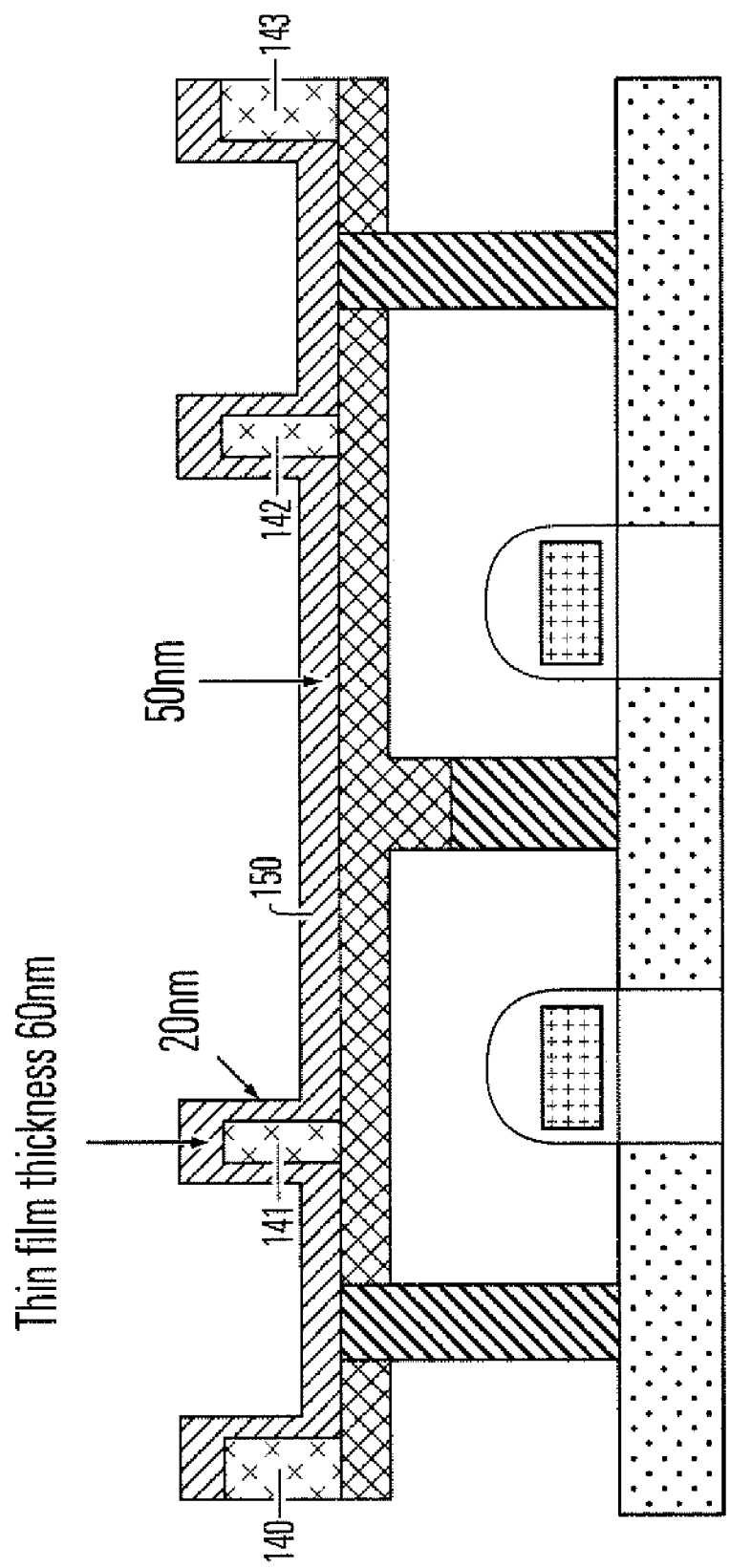
FIG. 12 shows a cross-sectional view corresponding to steps for depositing an electrode material over the structure resulting from the etch of FIG. 11.

FIG. 12 illustrates a next stage in the process, after deposition of a thin film 150 of electrode material over the trenches in the oxide. In the representative embodiment, the electrode material comprises titanium nitride deposited by physical vapor deposition. Other electrode materials can be utilized as well, including tantalum nitride, tungsten nitride, tantalum aluminum nitride, copper, aluminum or other materials which can provide suitable contact to the programmable resistive material used in the memory cell. The material in the illustrated example has a thickness of about 60 nanometers on the top of the insulating walls 141, 142, a thickness of about 20 nanometers on the side walls 135, 136, 137, 138 of the insulating walls 141, 142 and a thickness of about 50 nanometers over the plugs 110, 112 and over the layer 114.

Figure 13:
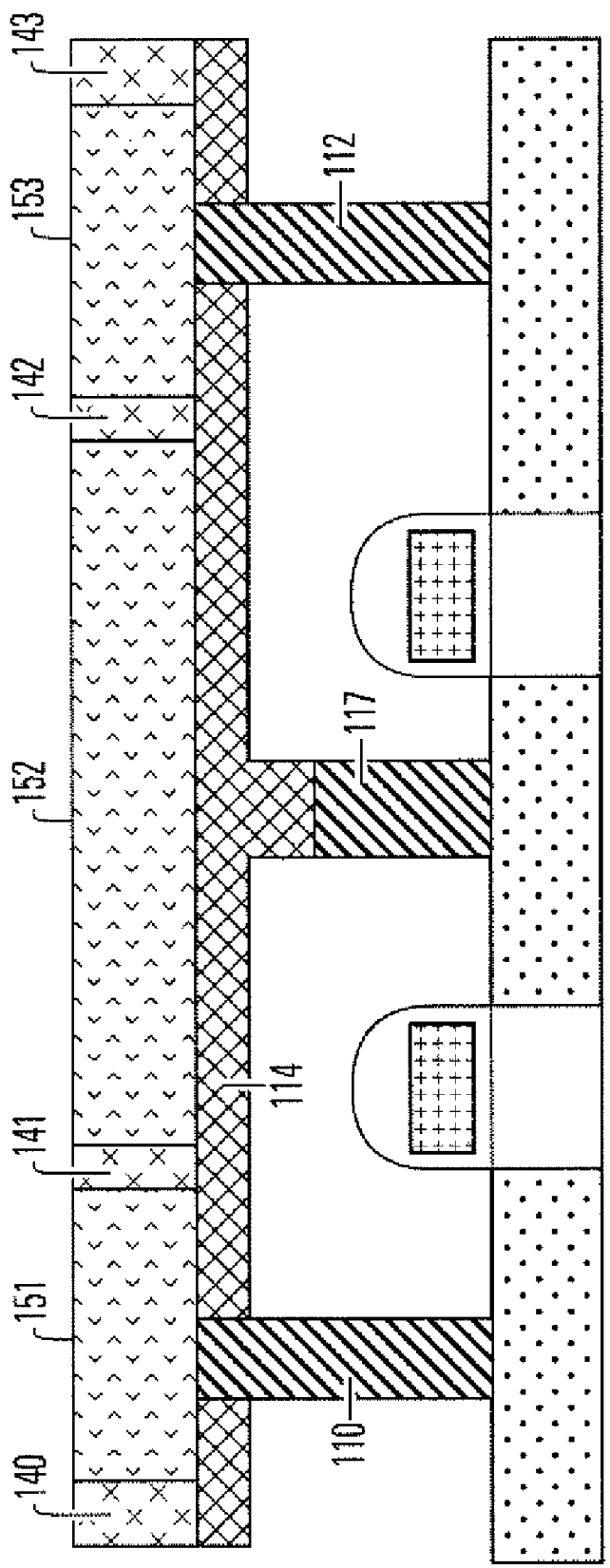
FIG. 13 shows a cross-sectional view of a first stage in an alternative process for forming an electrode material over the structure resulting from the etch of FIG. 11.
Figure 14:
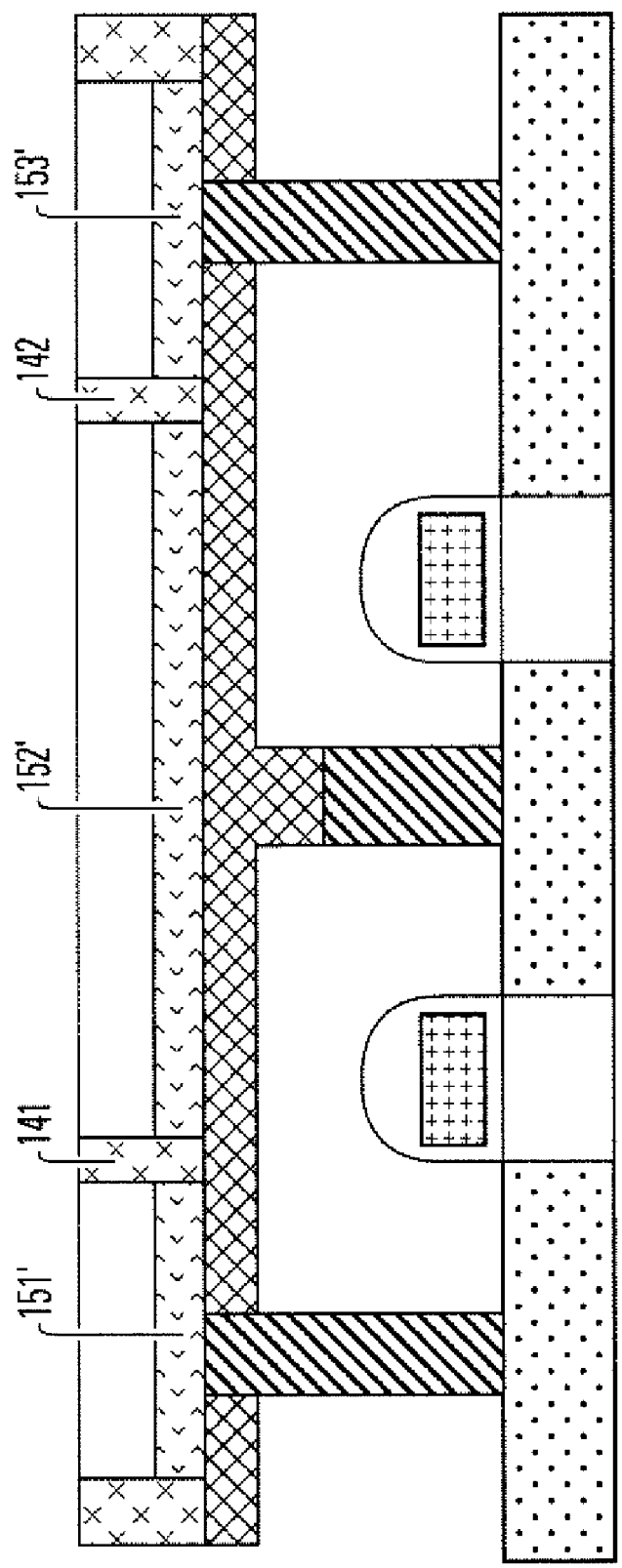
FIG. 14 shows a cross-sectional view of a second stage in the alternative process for forming an electrode material over the structure resulting from the etch of FIG. 11.
Figure 15:
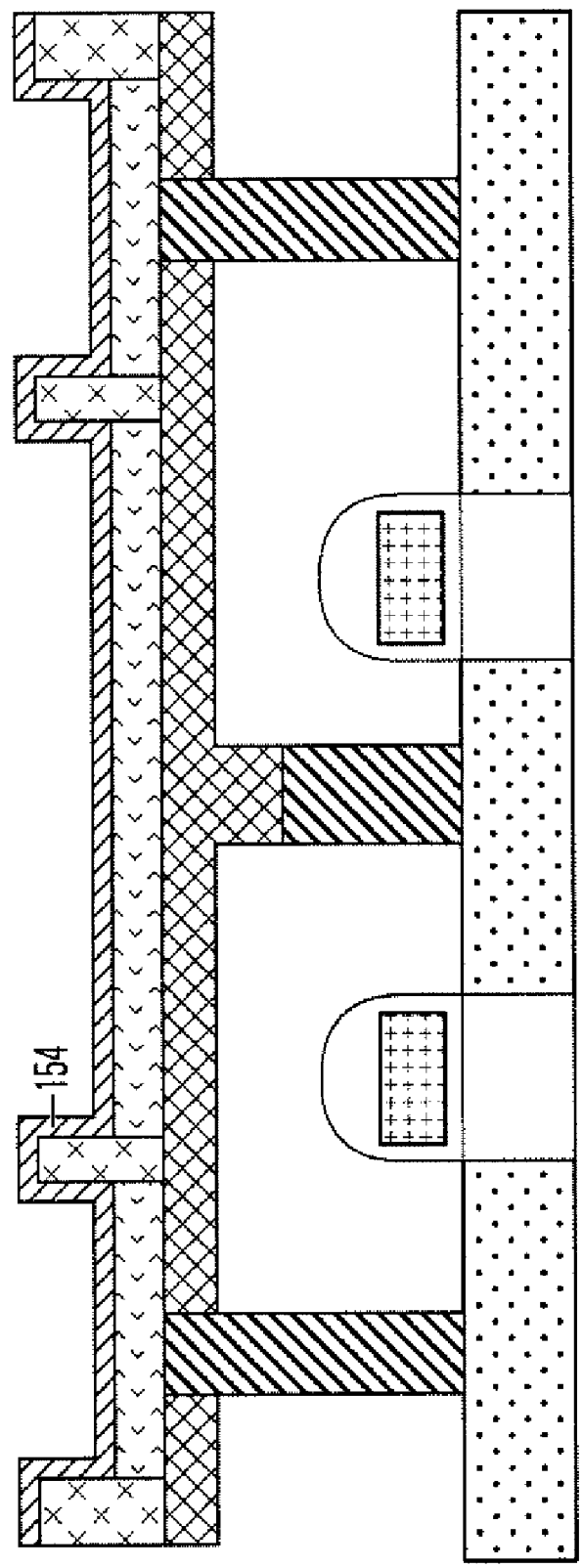
FIG. 15 shows a cross-sectional view of a third stage in the alternative process for forming an electrode material over the structure resulting from the etch of FIG. 11.

FIGS. 13-15 illustrate in alternative procedure for deposition of the electrode material. In a first stage in the alternative procedure, as shown in FIG. 13, a contact material such as tungsten, deposited by electrical plating or otherwise fills the trenches, including regions between the insulating walls 140, 141, 142, 143 in the oxide layer. The material is etch backed by chemical mechanical polishing or otherwise, to planarized the structure, and to expose the top surfaces of the insulating walls 140, 141, 142, 143. As a result, contact bodies 151, 152, 153 are formed within the trenches. The contact bodies 151 and 153 contact the plugs 110, 112. The contact body 152 is isolated from the source line by the layer 114.

FIG. 14 illustrates a next stage in the alternative process for electrode formation, in which the contact bodies 151, 152, 153 are etched back so that they have a thickness less than the depth of the trenches, resulting in contact pads 151', 152', 153' in the bottom of the trenches on both sides of the insulating walls 141, 142. For a tungsten contact body, the patricidal wet etching can be utilized for this etchback step. Next, as shown in FIG. 15, a layer 154 of electrode material, such as titanium nitride, is deposited using chemical vapor deposition or physical vapor deposition over the contact pads 151', 152', 153' and the insulating walls 141, 142. From in this point, the manufacturing process can proceed from either the structure shown in FIG. 15 or in FIG. 12. In this example, the procedure is described following from the structure of FIG. 12.

Figure 16:
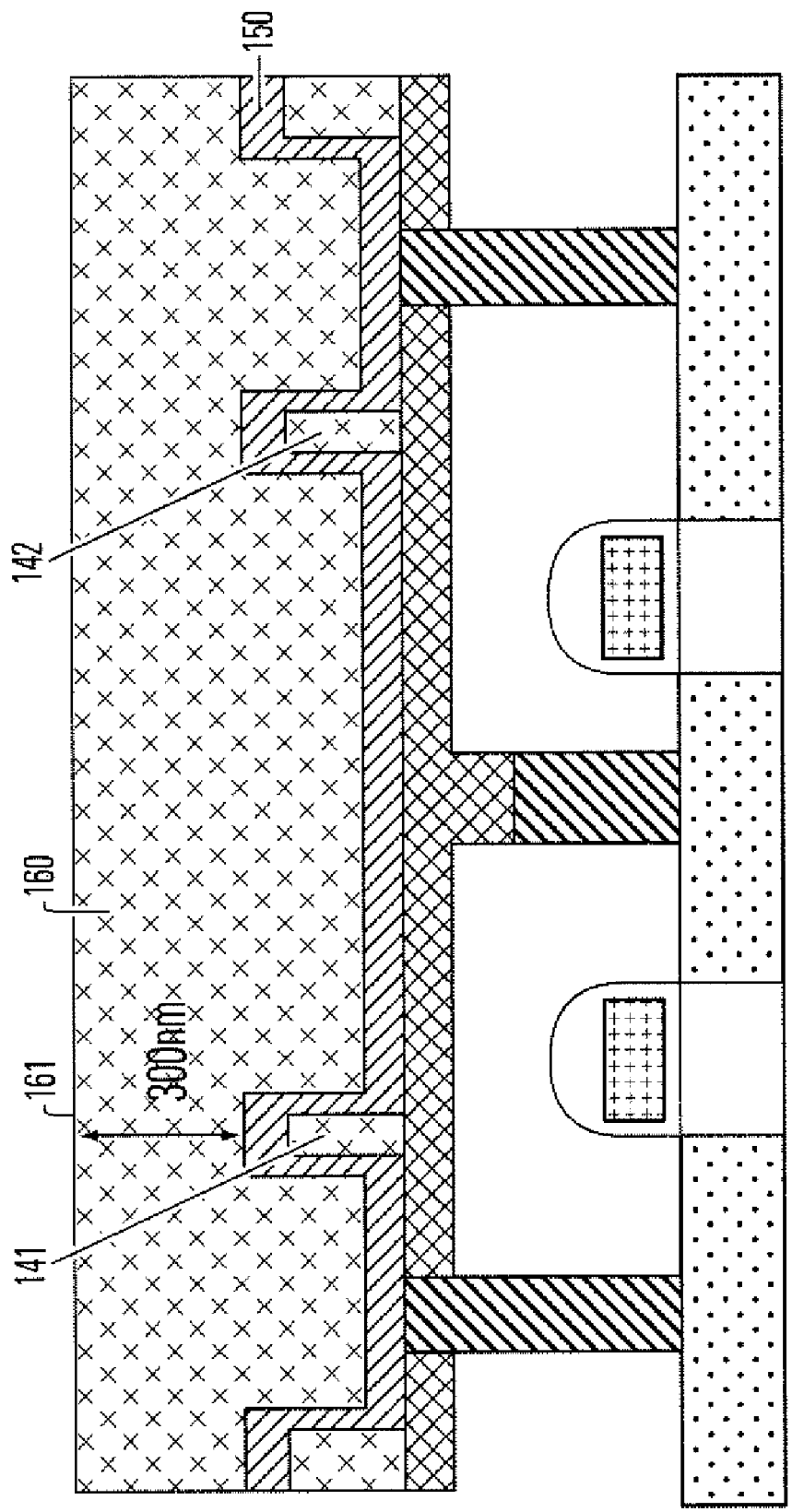
FIG. 16 shows a cross-sectional view of a next stage in the process for manufacturing the device, flowing from the structure of FIG. 12.

As shown in FIG. 16, the structure shown in FIG. 12 including the layer 150 of electrode material is covered with a fill layer 160. (The same fill layer could be applied to the structure of FIG. 15.) The fill layer 160 in the illustrated example is silicon dioxide filled to a height of about 300 nanometers higher than the top of the electrode layer 150 on top of the insulating walls 141, 142. The fill layer 160 at this stage preferably has a relatively planar top surface 161, to support a subsequent polishing and planarizing step. Other fill materials could be used as well, including silicon nitride.

FIGS. 17A and 17B illustrate a next stage in the process after chemical mechanical polishing or other polishing or etchback technique, which cuts back to structure shown in FIG. 16 to remove the electrode material over the top of the insulating walls 141, 142, and to form the resulting insulating walls 141' and 142', with exposed top surfaces 141A and 142A. This polishing technique in the embodiment shown in FIG. 16 may remove about 400 nanometers of material, which is an amount sufficient to remove the 300 nanometers of thickness above the top of the electrode material, and of the about 60 nanometers of electrode material on top of the insulating wall with sufficient manufacturing margin. As shown in FIG. 17A, the top surface of the resulting structure has exposed surfaces 162B, 163A, 163B, 164A of the electrode material from the tops of sidewall structures in the trenches and exposed top surfaces 141A and 142A of insulating walls 141, 142. This process results in pan-shaped electrode members 162, 163, 164 which are filled with an insulator fill. The pan-shaped electrode members 162, 163, 164 include sidewall structures on the sides of the insulating walls 141' and 142'. The pan-shaped electrode members 162, 163, 164 also included pad members having thicknesses which are less than the height of the sidewall structures, and extend generally orthogonally away from the sidewall structures. The pad members are adapted for electrical connection to the plugs in 110, 112 in the underlying structure, and to plugs used for connection to overlying metal as described above. The sidewall structures are exposed at the surface of the structure, including electrode surface 162B on the electrode member 162, electrode surface 163A on the electrode member 163, electrode surface 163B on the electrode member 163, and electrode surface 164A on the electrode member 164. The electrode surface 162B is on the top of the sidewall structure on the left side of the insulating wall 141'. The electrode surface 163A is on the top of the sidewall structure on the right side of the insulating wall 141'. The electrode surface 163B is on the top of the sidewall structure on the left side of the insulating wall 142'. The electrode surface 164A is on the top of the sidewall structure on the right side of the insulating wall 142'. The top surface 141A of the insulating wall 141' is essentially coplanar with the top surfaces 162B and 163A in the illustrated embodiment. Likewise, the top surface 142A of the insulating wall 142' is essentially coplanar with the top surfaces 163B and 164A in the illustrated embodiment.

Figure 18:
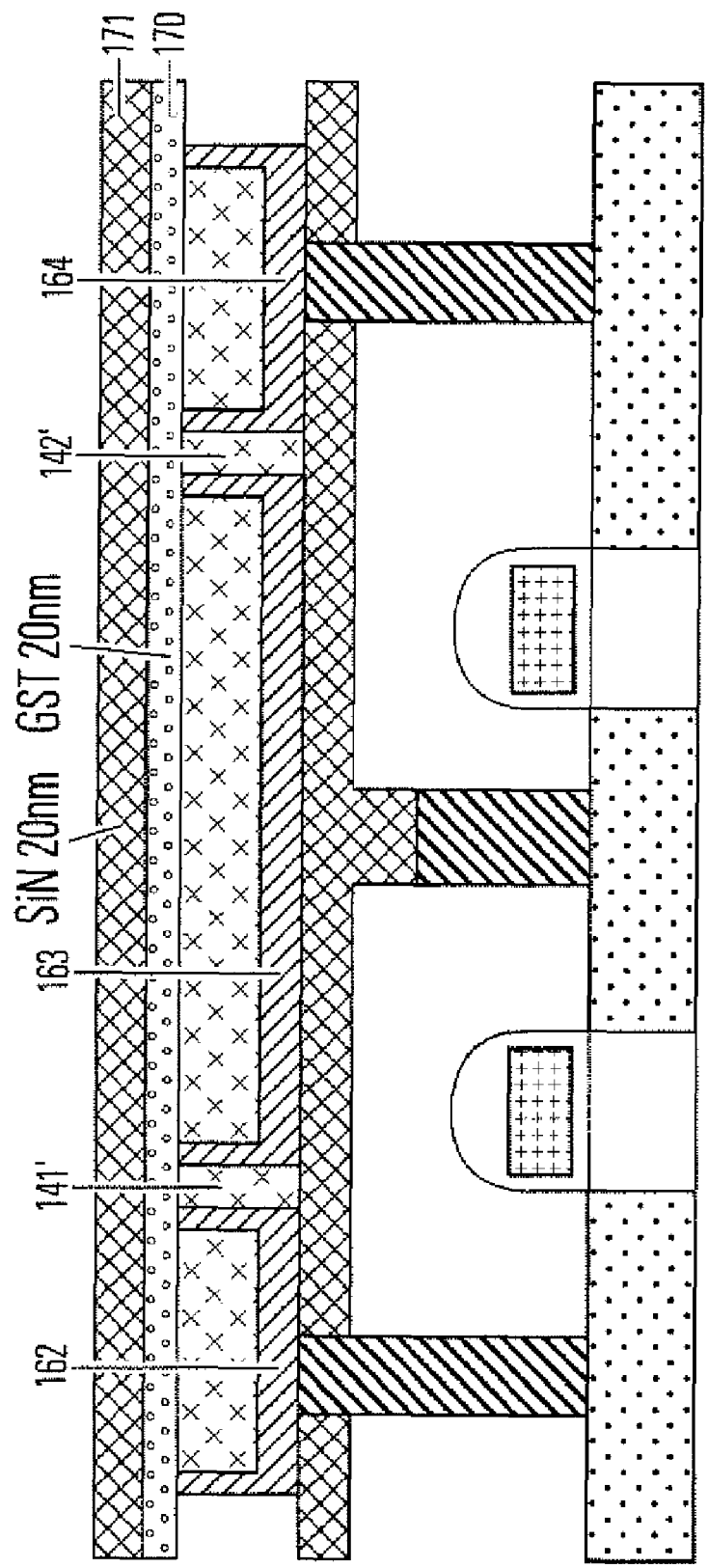
FIG. 18 shows a cross-sectional view of a next stage in the process in which a layer of memory material is formed over the structure of FIGS. 17A and 17B.

FIG. 18 illustrates a next stage in the process after deposition of a layer 170 of GST, or other suitable programmable resistive material, followed by a layer 171 of low temperature deposited SiN or other protective material over the GST to protect the GST from subsequent processing steps. The layer of GST is deposited for example by sputtering without collimation at about 250 degrees C. or other deposition technique after a step to precleaning top surfaces of the electrode structures. In the illustrated embodiment, the layer 170 and the layer 171 are about 20 nanometers thick. Of course the thicknesses of the materials can be adjusted as suits the needs of the particular implementation. However, it is desirable that the GST layer 170 be formed as thin as practical for the purposes of limiting the magnitude of the reset current needed for changing the phase of the material.

Figure 19A:
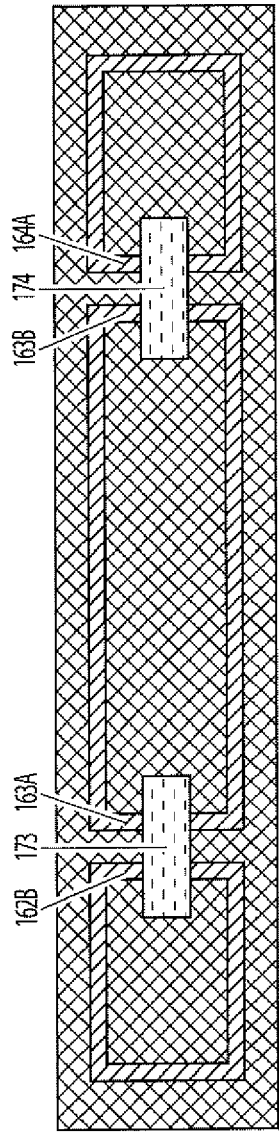
FIGS. 19A and 19B show layout and cross-sectional views of masks used for patterning the layer of memory material of FIG. 18, used to position bridges of memory material on the electrode layer.
Figure 19B:
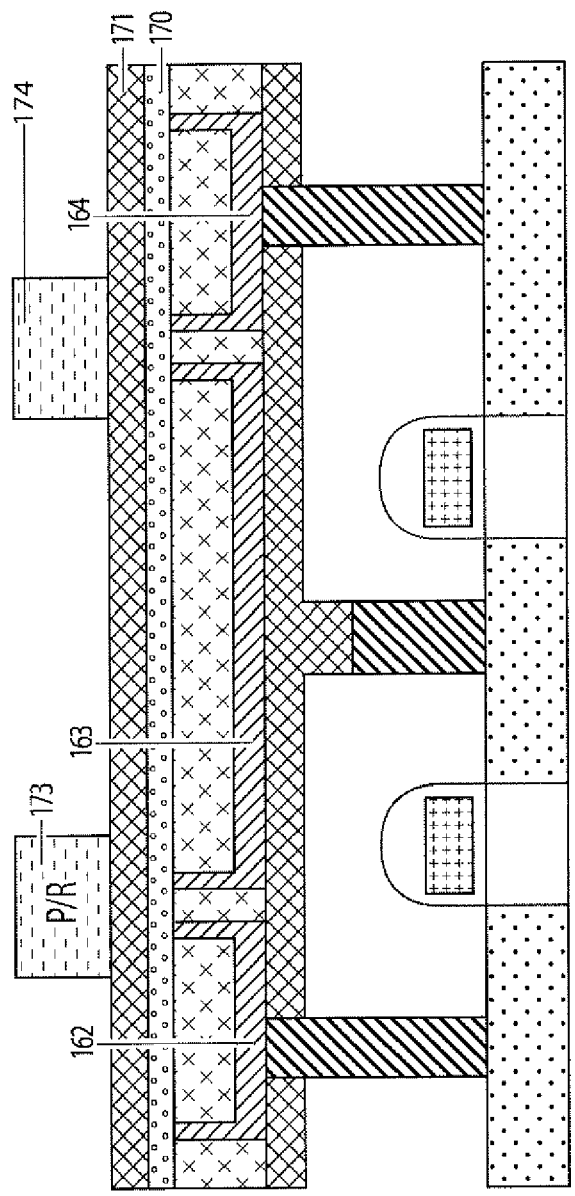

FIGS. 19A and 19B illustrate a next stage in the process, in which a lithographic mask comprising photoresist or other suitable mask material is formed defining patches 173, 174 to define the positions of bridges of memory material as described below. The patch 173 spans across the surface 162B of the electrode member 162, the surface 141A of the insulating wall 141', and the surface 163A of the electrode member 163. The patch 174 spans across the surface 163B of the electrode member 163, the surface 142A of the insulating wall 142', and the surface 164A of the electrode member 164. The patches 173, 174 of photoresist are made as narrow as possible according to the lithographic process applied. For example, the patches 173, 174 have a width equal to the minimum feature size F for the lithographic process used, where the minimum feature size for a process may be on the order of 0.2 microns (200 nm), 0.14 microns, or 0.09 microns in current mask lithographic processes. Obviously, embodiments of the process can be adapted to narrower minimum feature sizes as lithographic processes advance.

FIGS. 20A and 20B illustrate a next stage in the process, in which the mask patches 173, 174 are trimmed to form trimmed masks 173', 174'. For an embodiment where the patches 173, 174 are implemented using photoresist, the trimmed patches 173' and 174' can be formed by using an oxide based plasma etch of the photoresist material, reducing the width of the trimmed patches 173' and 174' to a width which is less than the minimum lithographic features sized used for forming the patches 173 and 174. In illustrated example, the resulting width of the trimmed patches 173' and 174' is about 40 nanometers.

Figure 21A:
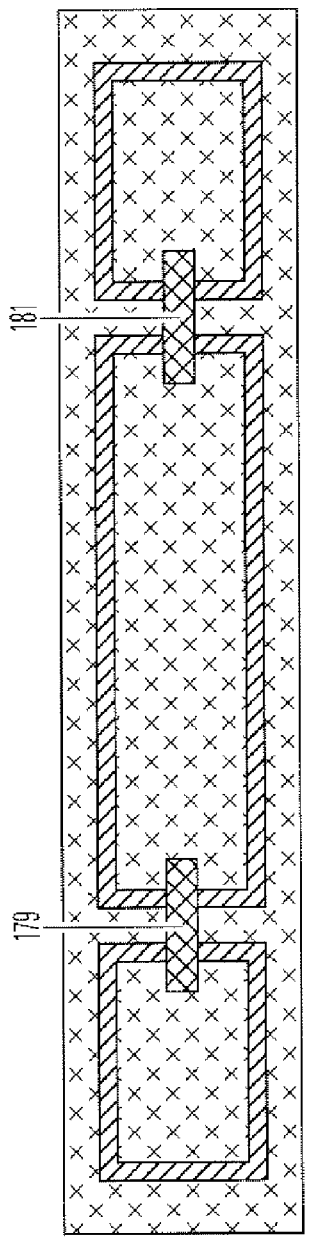
FIGS. 21A and 21B show layout and cross-sectional views of bridges of memory material resulting from an etch of the layer of memory material of FIG. 18, using the trimmed masks.
Figure 21B:
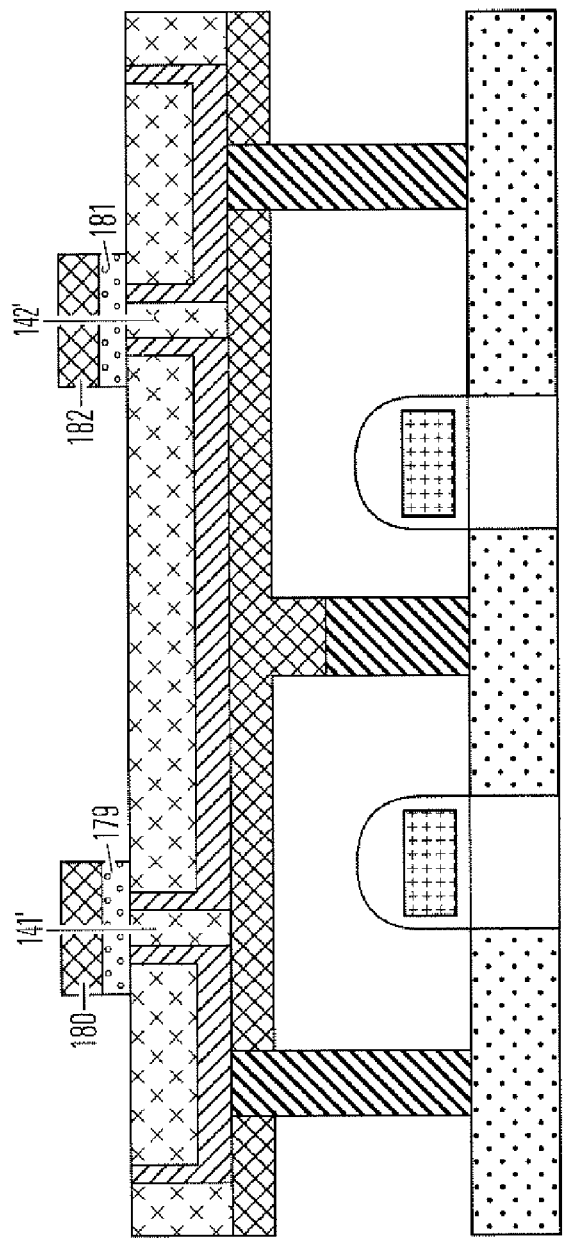

FIGS. 21A and 21B illustrate a next stage in the process, in which the more narrow photoresist masks 173', 174' are used for an etch mask, and the thin film layers 171 and 170 of protective material and memory material are etched to lithographically define bridges 179 and 181 of memory material, with the protective caps 180 and 182, respectively. As shown, the bridges 179 and 181 span across the insulating walls 141' and 142', and the surfaces of the sidewall structures on the electrode members. In embodiments of the process the memory material comprises a GST chalcogenide based material, and is etched using for example, a chlorine-based or fluorine-based, reactive ion etching process. The bridges 179 and 181 as shown in this example have a width on the order of 40 nanometers defined by the trimmed masks 173' and 174', and illustrated example, a thickness on the order of 20 nanometers defined by the thickness of the layer 170, and contact areas between the electrode structures defined by the width of the sidewall structures, which in this example are also about 20 nanometers. Preferably, the widths of the bridges are less than 50 nanometers, and more preferably even less than 40 nanometers in order to produce a memory element having dimensions of small is possible an active region where the phase change occurs during programming.

Figure 22:
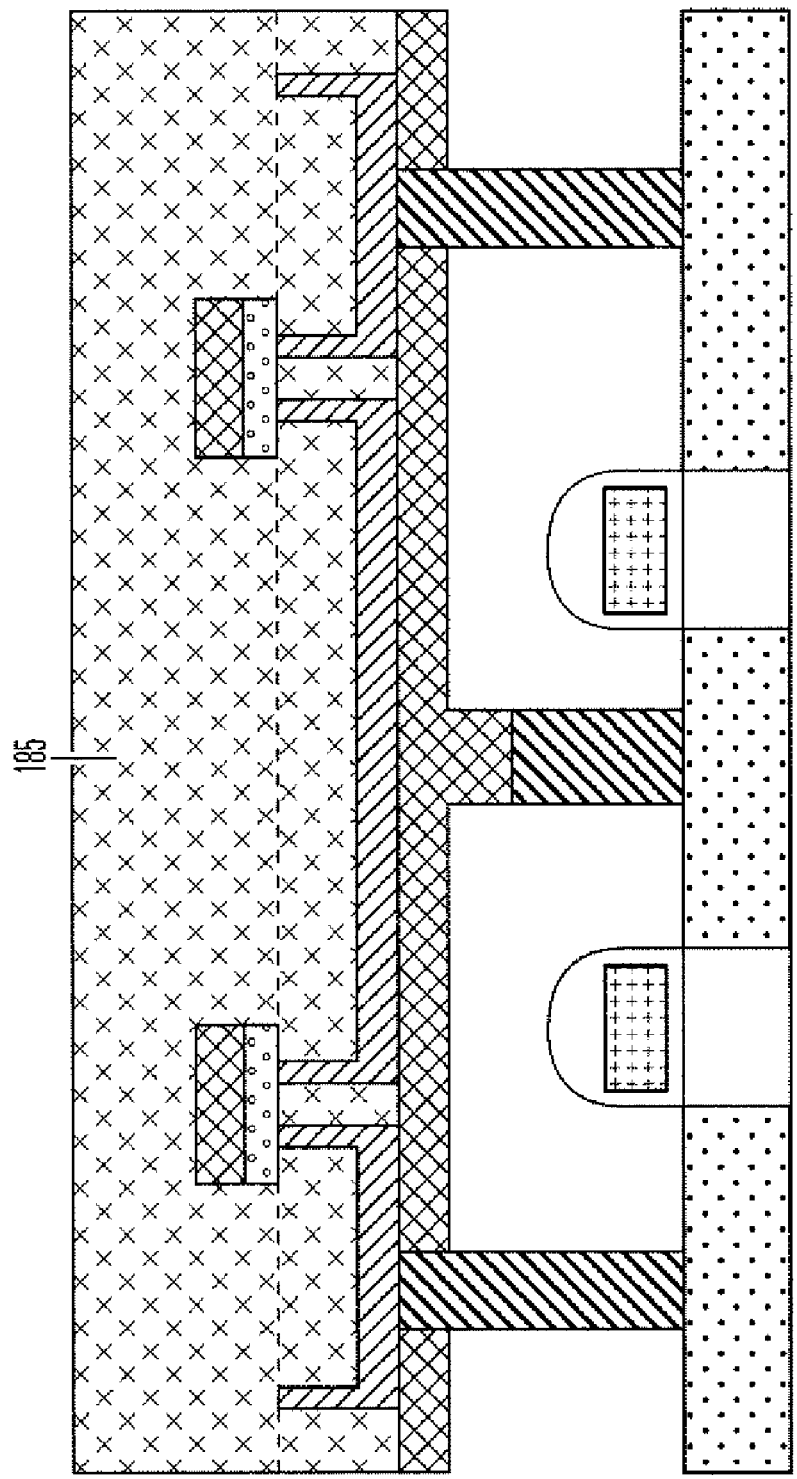
FIG. 22 shows a cross-sectional view after formation of a fill on the structure of FIGS. 21A and 21B.

FIG. 22 illustrates a next stage in the process, in which an insulating fill 185 is applied to form an interlayer dielectric, and provide a substrate for formation of a patterned metal layer in subsequent steps. The insulating fill 185 may comprise one or more layers of silicon dioxide or other suitable dielectric materials, deposited using well-known deposition technologies.

Figure 24:
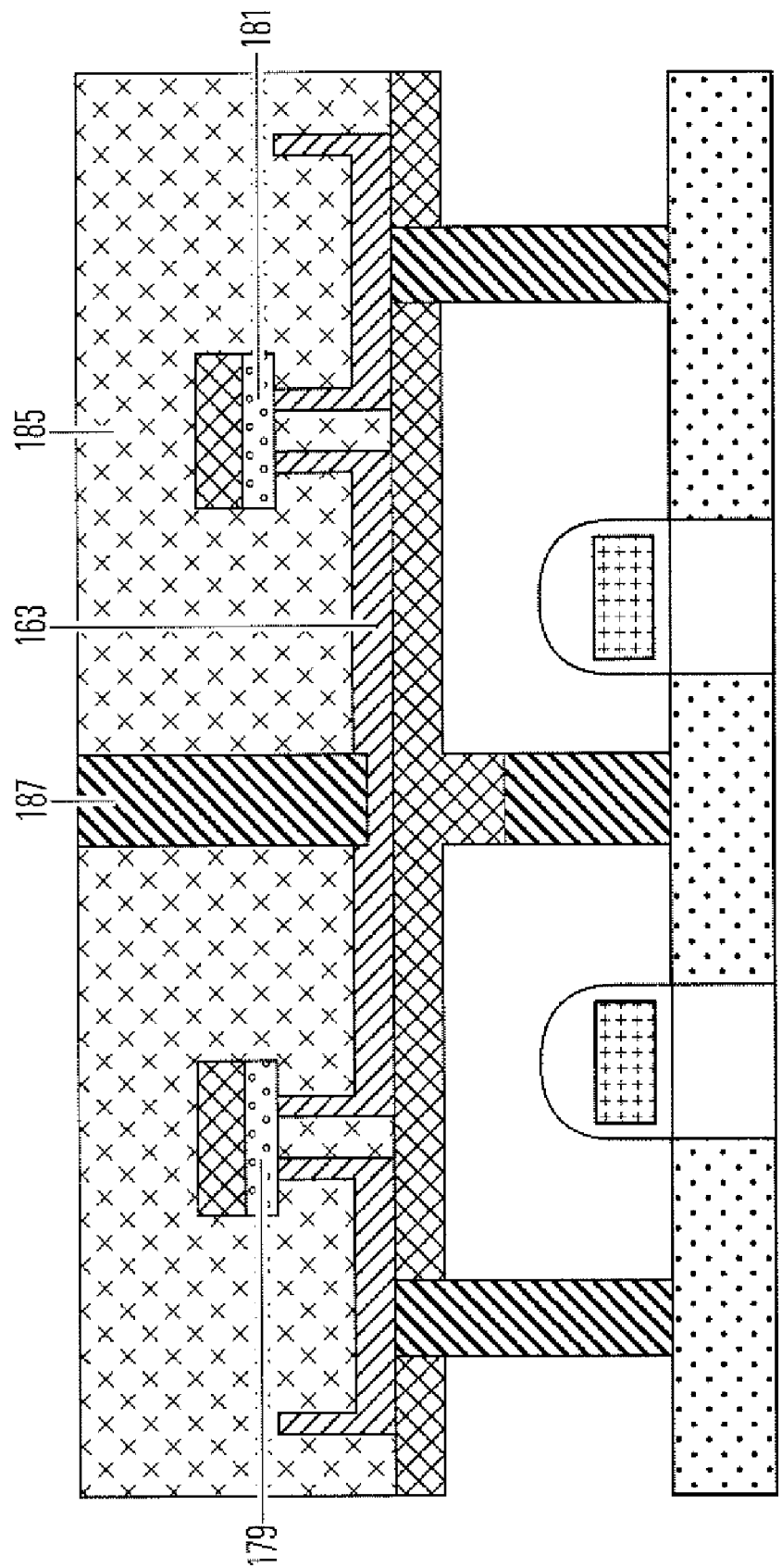
FIG. 24 illustrates a stage of the process after filling the via of FIG. 23B with a conductive material

FIGS. 23A and 23B illustrate a next stage in the process, in which a via 186 is patterned and opened in the dielectric fill, using interlayer via etching technologies known in the art, and extending down to the pad structure of the electrode member 163. In the next stage, as illustrated in FIG. 24, the via is filled with a conductive material such as tungsten using tungsten plug technologies known in the art. The resulting structure comprises a tungsten plug 187 through the fill layer 185 in the insulator fill within the pan-shaped electrode member 163, and contacting the pad structure on the electrode member 163.

Figure 25:
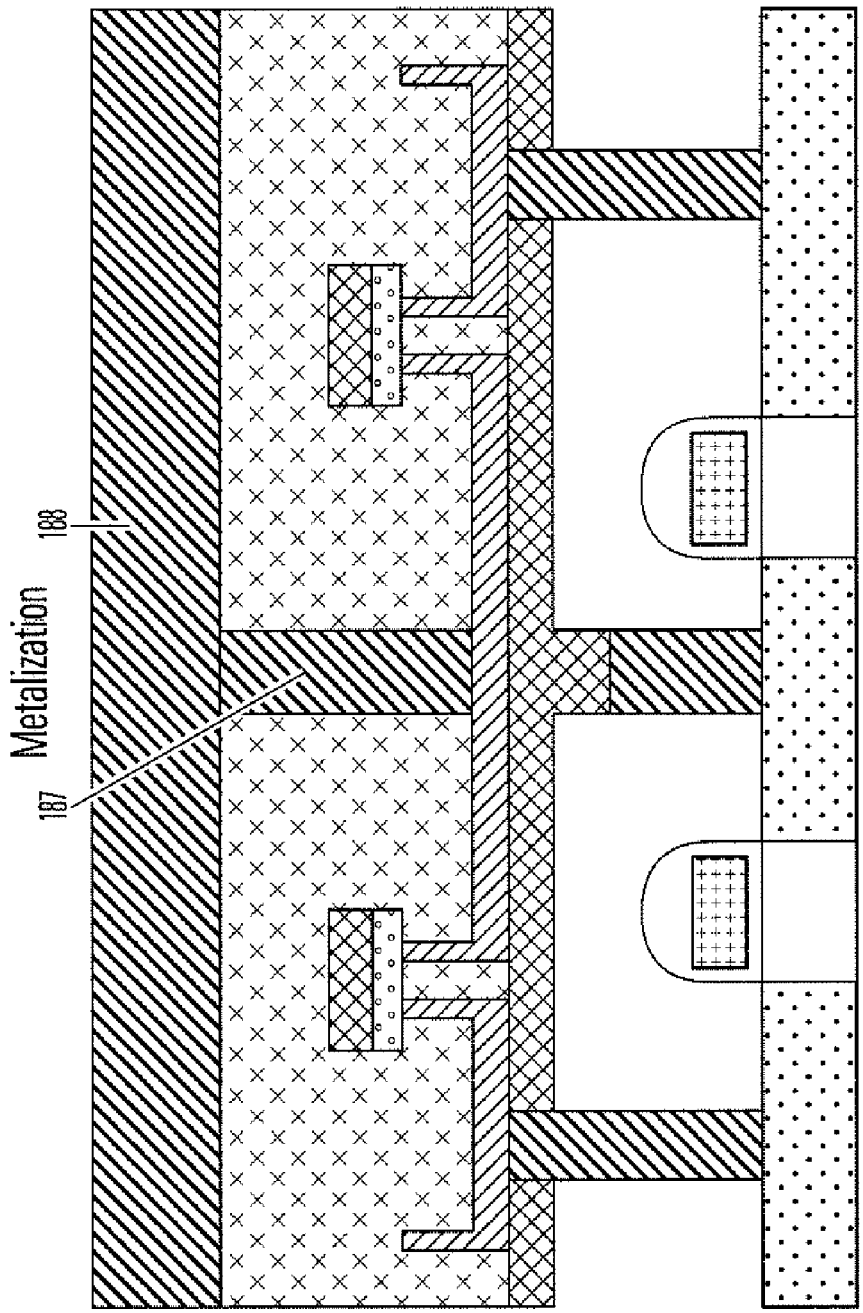
FIG. 25 illustrates a stage in the process after formation of a patterned conductive layer structure over the structure shown in FIG. 24.

FIG. 25 illustrates formation of the patterned metal layer defining a bitline 188 contacting the plug 187, and similar plugs along a column of memory cells. The structure illustrated in FIG. 25 has the configuration illustrated in FIG. 3. In embodiments of the process, a copper alloy damascene metallization process is used in which the patterned conductive layer is formed depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. Other embodiments can use standard Al—Cu processes, or other metallization processes known in the art.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A memory device, comprising:
    a first pan-shaped electrode having a first side wall structure with a top side and a width at the top side;
    a second pan-shaped electrode having a second side wall structure with a top side and a width at the top side;
    an insulating wall between the first side wall structure and the second side wall structure, the insulating wall having a thickness between the first and second side wall structures near the top side of the first side wall structure and the top side of the second side wall structure; and
    a bridge across the insulating wall, the top side of the first side wall structure, and the top side of the second side wall structure, the bridge having a first side and a second side and contacting the top sides of first and second side wall structures on the first side, and defining an inter-electrode current path through the bridge between the first and second side wall structures across the insulating wall, the inter-electrode current path having a path length defined by the thickness of the insulating wall, wherein the bridge comprises programmable resistive material.

2. The device of claim 1, wherein the widths of the first and second side wall structures at the top sides are sufficient to provide electrical contacts to the bridge and less than about 50 nm.

3. The device of claim 1, wherein the first pan-shaped electrode and second pan-shaped electrode respectively comprise a pad member in electrical communication with the respective first and second sidewall structures and having a thickness less than the height of the respective first and second sidewall structures extending generally away from the insulating wall.

4. The device of claim 1, wherein the thickness of the insulating wall is about 50 nm or less, and said bridge comprises a thin film with a thickness about 50 nm or less and a width about 50 nm or less, and wherein the widths of the first and second electrodes at the top sides are sufficient to provide electrical contacts to the bridge and less than about 50 nm.

5. The device of claim 1, wherein the thickness of the insulating wall is about 40 nm or less, and said bridge comprises a thin film with a thickness about 20 nm or less and a width about 20 nm or less.

6. The device of claim 1, wherein said bridge comprises a thin film with a thickness about 10 nm or less and a width about 40 nm or less.

7. The device of claim 1, wherein the first and second electrodes and insulating wall comprise elements in a single layer of materials having a substantially planar top surface, and the bridge includes a top side and a bottom side, the bottom side contacting the substantially planar top surface of the single layer, whereby said first side is the bottom side.

8. The device of claim 1, wherein the material has at least two solid phases reversibly inducible by a current.

9. The device of claim 1, wherein the material has at least two solid phases reversibly inducible by a voltage applied across the first and second electrodes.

10. The device of claim 1, wherein the material has at least two solid phases, including a generally amorphous phase and a generally crystalline phase.

11. The device of claim 1, wherein the insulating wall comprises silicon nitride.

12. The device of claim 1, wherein the thickness of the insulating wall is less than a minimum lithographic feature size of a lithographic process used to form the device.

13. The device of claim 1, wherein the bridge has a width between the first and second sides less than a minimum lithographic feature size of a lithographic process used to form the device.

14. The device of claim 1, wherein the widths of the first and second side wall structures at the top sides are less than a minimum lithographic feature size of a lithographic process used to form the device.

15. The device of claim 1, wherein the bridge comprises an alloy including a combination of Ge, Sb, and Te.

16. The device of claim 1, wherein the bridge comprises an alloy including a combination of two or more materials from the group of Ge, Sb, Te, Se, In, Ti, Ga, Bi, Sn, Cu, Pd, Pb, Ag, S, and Au.

17. The device of claim 1, wherein the first and second electrodes comprise an element selected from a group consisting of Ti, W, Mo, Al, Ta, Cu, Pi, Ir, La, Ni, and Ru and alloys thereof.

18. The device of claim 1, wherein the first and second electrodes comprise Ti and N.

19. The device of claim 1, wherein the first and second electrodes comprise Ta and N.

* * * * *